(12) United States Patent
Tanaka et al.

(10) Patent No.: US 8,138,489 B2
(45) Date of Patent: Mar. 20, 2012

(54) NON-VOLATILE SEMICONDUCTOR STORAGE DEVICE AND METHOD OF MANUFACTURING THE SAME

(75) Inventors: Hiroyasu Tanaka, Tokyo (JP); Masaru Kidoh, Komae (JP); Ryota Katsumata, Yokohama (JP); Masaru Kito, Yokohama (JP); Yosuke Komori, Yokohama (JP); Megumi Ishiduki, Yokohama (JP); Hideaki Aochi, Kawasaki (JP); Yoshiaki Fukuzumi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 251 days.

(21) Appl. No.: 12/562,402

(22) Filed: Sep. 18, 2009

(65) Prior Publication Data

US 2010/0117047 A1    May 13, 2010

(30) Foreign Application Priority Data

Nov. 10, 2008    (JP) ................................ 2008-287881

(51) Int. Cl.
  *H01L 47/00*    (2006.01)
(52) U.S. Cl. .. 257/4; 257/2; 257/3; 257/5; 257/E29.148; 257/E29.338; 365/148; 438/534; 438/570
(58) Field of Classification Search .................. 257/1, 2, 257/3, 4, 5, 471, 476, 528, E29.148, E29.338; 365/46, 100, 103, 104, 105, 148, 242, 243; 438/534, 570

See application file for complete search history.

(56) References Cited

U.S. PATENT DOCUMENTS

| 7,709,885 B2 * | 5/2010 | Daley et al. ................... 257/329 |
| 2007/0252201 A1 | 11/2007 | Kito et al. |
| 2008/0175032 A1 | 7/2008 | Tanaka et al. |
| 2008/0203378 A1 | 8/2008 | Tanaka et al. |

FOREIGN PATENT DOCUMENTS

JP    2008-181978    8/2008

* cited by examiner

*Primary Examiner* — Evan Pert
*Assistant Examiner* — Eduardo A Rodela
(74) *Attorney, Agent, or Firm* — Oblon, Spivak, McClelland, Maier & Neustadt, L.L.P.

(57) ABSTRACT

A non-volatile semiconductor storage device includes a plurality of memory element groups, each of the memory element groups having a plurality of memory elements, each of the memory elements having a resistance-change element and a Schottky diode connected in series. Each of the memory element groups includes: a first columnar layer extending in a lamination direction; a first insulation layer formed on a side surface of the first columnar layer and functioning as the resistance-change element; and a first conductive layer formed to surround the first columnar layer via the first insulation layer. The first conductive layer is formed of metal. The first columnar layer is formed of a semiconductor having such a impurity concentration that the first conductive layer and the semiconductor configure the Schottky diode.

20 Claims, 22 Drawing Sheets

NON-VOLATILE SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2008-287881, filed on Nov. 10, 2008, the entire contents of which are incorporated herein by reference.

BACKGROUND OF THE INVENTION

1. Field of the Invention

The present invention relates to an electrically rewritable non-volatile semiconductor storage device and a method of manufacturing the same.

2. Description of the Related Art

Reduced design rules are required for highly integrated semiconductor storage devices with increasing capacity demands. Reducing the design rules requires further refinement in wiring patterns, and so on. For example, as further refinement in wiring patterns requires more sophisticated processing techniques, it is more difficult to reduce such design rules.

Therefore, such semiconductor storage devices have been proposed recently where memory elements are arranged in a three-dimensional manner to achieve improved integration of memory devices (Patent Document 1: Japanese Patent Laid-Open No. 2008-181978). According to Patent Document 1, each memory element has a configuration of a p-n diode and a resistance-change element being connected in series.

However, the semiconductor storage device with the above-mentioned p-n diodes has a problem with wiring resistance, and so on. Therefore, it is not possible to enhance signals from memory cells, which would lead to insufficient reliability of the their operation.

SUMMARY OF THE INVENTION

One aspect of the present invention provides a non-volatile semiconductor storage device comprising: a plurality of memory element groups, each of the memory element groups having a plurality of memory elements, each of the memory elements having a resistance-change element and a Schottky diode connected in series, each of the memory element groups comprising: a first columnar layer extending in a lamination direction; a first insulation layer formed on a side surface of the first columnar layer and functioning as the resistance-change element; and a first conductive layer formed to surround the first columnar layer via the first insulation layer, the first conductive layer being formed of metal, and the first columnar layer being formed of a semiconductor having such a impurity concentration that the first conductive layer and the semiconductor configure the Schottky diode.

In addition, another aspect of the present invention provides a non-volatile semiconductor storage device comprising: a plurality of memory element groups, each of the memory element groups having a plurality of memory elements, each of the memory elements having a resistance-change element and a Schottky diode connected in series, each of the memory element groups comprising: a first columnar layer extending in a lamination direction; a first insulation layer formed on a side surface of the first columnar layer and functioning as the resistance-change element; and a first conductive layer formed to surround the first columnar layer via the first insulation layer, the first columnar layer being formed of metal, and the first conductive layer being formed of a semiconductor having such a impurity concentration that the first conductive layer and the semiconductor configure the Schottky diode.

Moreover, still another aspect of the present invention provides a method of manufacturing a non-volatile semiconductor storage device having a plurality of memory element groups, each of the memory element groups having a plurality of memory elements, each of the memory elements having a resistance-change element and a Schottky diode connected in series, the method comprising: laminating a plurality of first conductive layers; forming a first hole to penetrate the plurality of first conductive layers; forming a first insulation layer on a side surface of the first hole, the first insulation layer functioning as the resistance-change element; forming a first columnar layer to fill up the first hole; the first conductive layers being formed of metal; and the first columnar layer being formed of a semiconductor having such a impurity concentration that the first conductive layers and the semiconductor configure the Schottky diode.

DETAILED DESCRIPTION OF THE EMBODIMENTS

Embodiments of a non-volatile semiconductor storage device according to the present invention will now be described below with reference to the accompanying drawings.

First Embodiment (General Configuration of Non-Volatile Semiconductor Storage Device 100 in First Embodiment)

Figure 1:
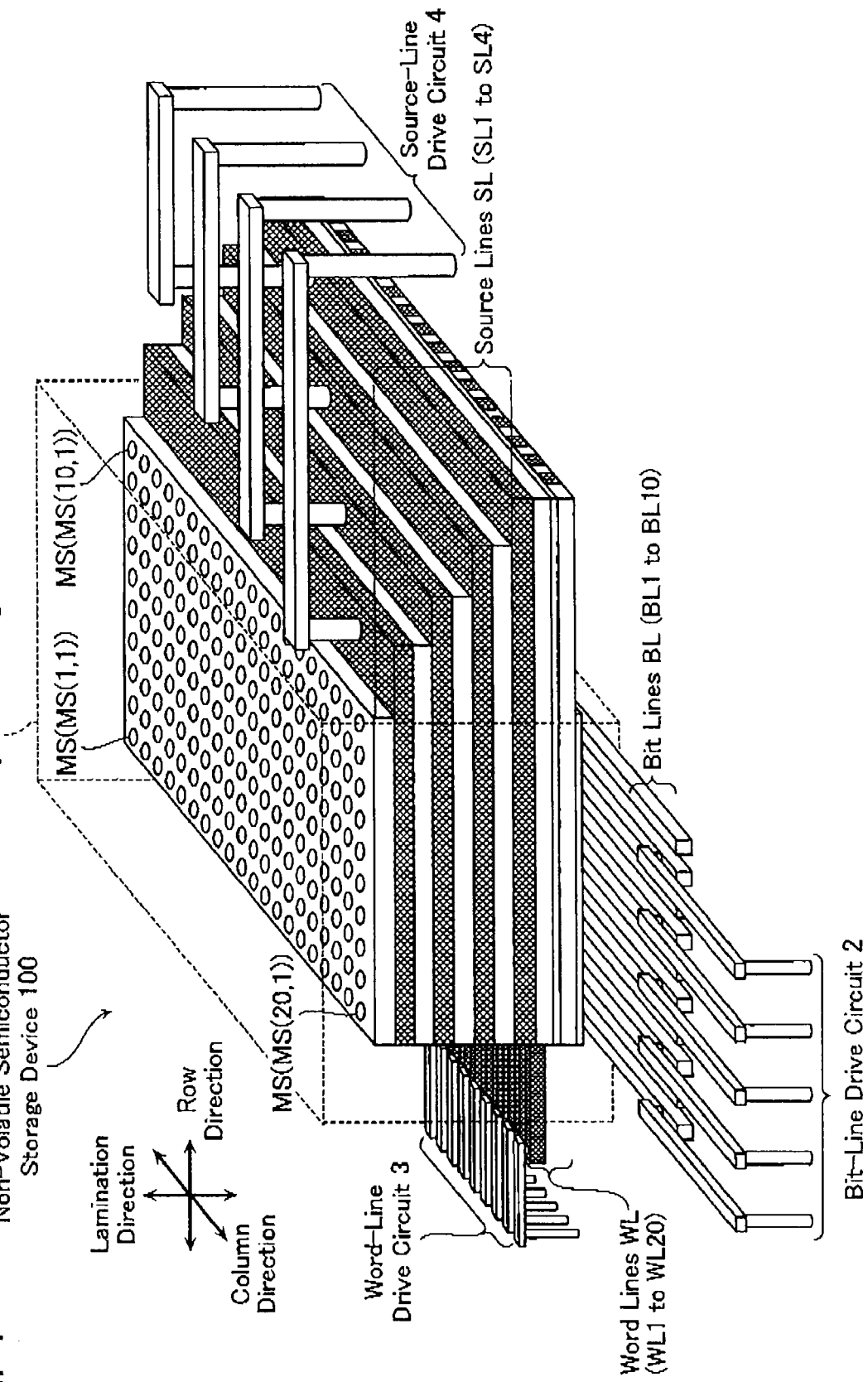
FIG. 1 is a schematic configuration diagram of a non-volatile semiconductor storage device 100 according to a first embodiment of the present invention.
Figure 2:
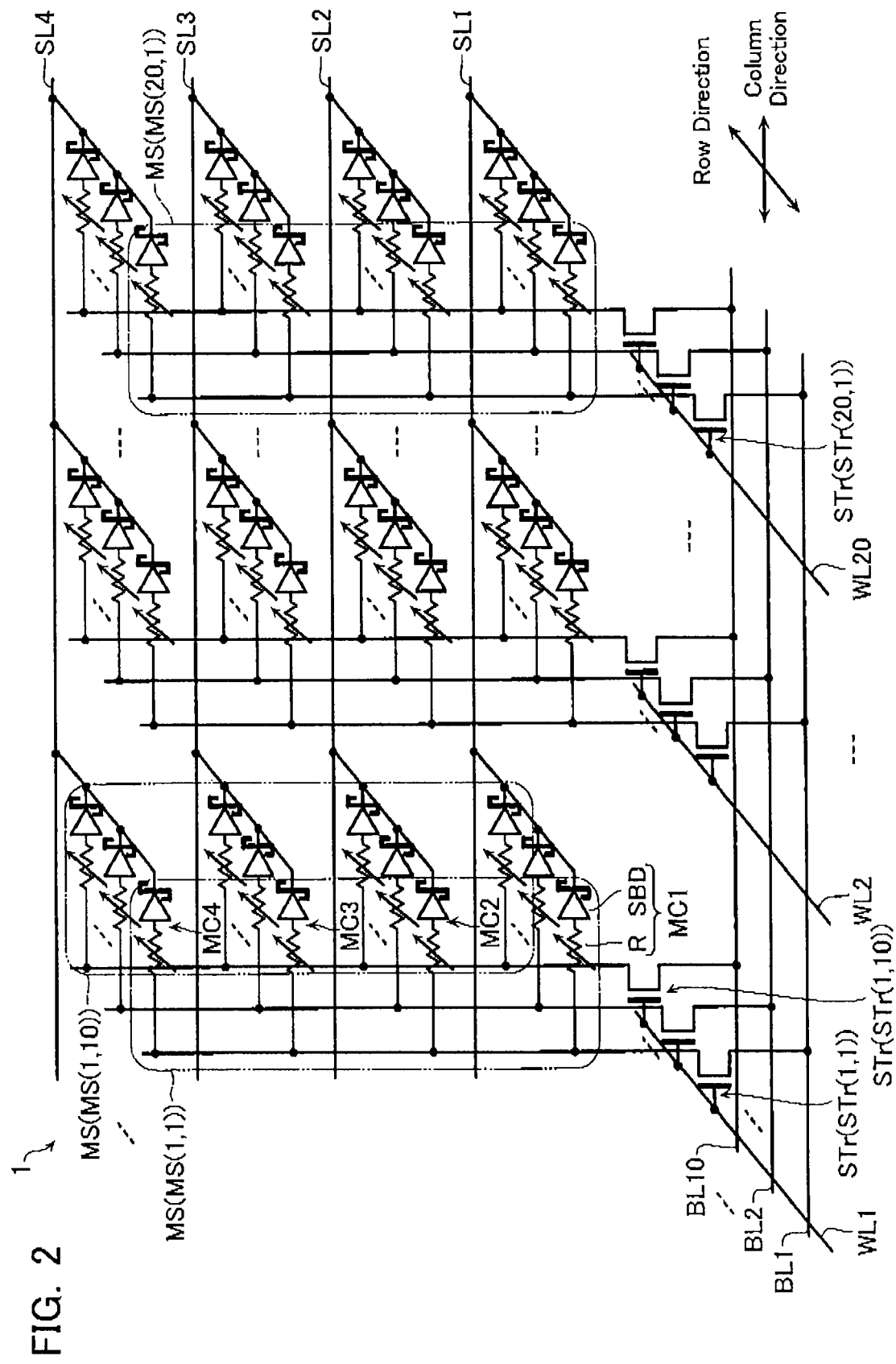
FIG. 2 is a circuit diagram of a memory element region 1.

Referring first to FIGS. 1 and 2, a general configuration of a non-volatile semiconductor storage device 100 according to a first embodiment will be described below. FIG. 1 is a schematic configuration diagram of the non-volatile semiconductor storage device 100 according to the first embodiment of the present invention. FIG. 2 is a circuit diagram of a memory element region 1 described below.

As illustrated in FIG. 1, the non-volatile semiconductor storage device 100 comprises a memory element region 1, a bit-line drive circuit 2, a word-line drive circuit 3, a source-line drive circuit 4, a sense amplifier (not illustrated), and so on.

The memory element region 1, which includes many memory elements arranged therein, is configured to be able to write data to or read data from respective memory elements. Although not illustrated in FIG. 1, the memory element region 1 includes a plurality of laminated conductive layers, columnar layers that are formed to penetrate the conductive layers, and insulation layers that are formed between the columnar layers and the conductive layers. Note that the configuration of the above-mentioned conductive layers, columnar layers, and insulation layers will be discussed in greater detail below.

As illustrated in FIGS. 1 and 2, the memory element region 1 has memory strings MS representing a plurality of memory element groups, a plurality of selection transistors STr, a plurality of source lines SL, a plurality of word lines WL, and a plurality of bit lines BL.

In the example illustrated in FIGS. 1 and 2, there are provided 20 rows and 10 columns of memory strings MS (MS(1,1) to MS(20,10)). Similarly, 20 rows and 10 columns of selection transistors STr (STr(1,1) to STr(20, 10)) are provided. In addition, four source lines (SL1 to SL4) are provided in a lamination direction. Moreover, twenty word lines WL (WL1 to WL20) are provided along a column direction orthogonal to the lamination direction. Furthermore, ten bit lines BL (BL1 to BL10) are provided along a row direction orthogonal to the lamination and column directions.

As illustrated in FIG. 2, the memory strings MS are formed in a matrix form in the row and column directions. Each of the memory strings MS includes four memory elements MC1 to MC4. Each of the memory elements MC1 to MC4 includes a resistance-change element R and a Schottky diode SBD.

Each resistance-change element R includes an insulation layer such as a silicon oxide layer. Each resistance-change element R changes its resistance value when it is broken down with a certain voltage applied thereto. Note that the non-volatile semiconductor storage device 100 according to the present invention stores information depending upon whether or not any resistance-change elements R are broken down. The configuration of the resistance-change elements R will also be discussed in greater detail below.

Each Schottky diode SBD includes a metal layer and an n-type semiconductor layer that are provided to sandwich an insulation layer (a resistance-change element R) therebetween. Each metal layer and each n-type semiconductor layer functions as a Schottky diode SBD when they come in contact with each other upon destruction of an insulation layer (a resistance-change element R). The configuration of the Schottky diodes SBD will be discussed in greater detail below.

The resistance-change elements R and the Schottky diodes SBD are connected in series. One ends of the resistance-change elements R are connected to the anodes of the Schottky diodes SBD. The other ends of four resistance-change elements R in the same memory string MS are commonly connected to each other. Among different memory strings MS (MS(1,1) to MS(20,10)), the cathodes of the Schottky diodes SBD in respective memory elements MC1 are commonly connected to a source line SL1. Similarly, the cathodes of the Schottky diodes SBD in respective memory elements MC2 are commonly connected to a source line SL2 among different memory strings MS. Moreover, the cathodes of the Schottky diodes SBD in respective memory elements MC3 are commonly connected to a source line SL3 among different memory strings MS. Furthermore, the cathodes of the Schottky diodes SBD in respective memory elements MC4 are commonly connected to a source line SL4 among different memory strings MS.

As illustrated in FIG. 2, one ends of the selection transistors STr are connected to the other ends of the respective memory strings MS (resistance-change elements R). The other ends of the selection transistors STr are connected to the respective bit lines BL. The control gates of the selection transistors STr are connected to the respective word lines WL. The selection transistors STr control conduction to the memory strings MS.

The source lines SL are formed to expand in a two-dimensional manner in the row and column directions. The bit lines BL are formed to extend in the column direction at a certain pitch in the row direction. The word lines WL are formed to extend in the row direction at a certain pitch in the column direction.

The bit-line drive circuit 2 drives a plurality of bit lines BL. The word-line drive circuit 3 drives a plurality of word lines WL. The source-line drive circuit 4 drives a plurality of source lines SL. The sense amplifier reads data from a plurality of source lines SL.

(Specific Configuration of Non-Volatile Semiconductor Storage Device 100 in First Embodiment)

Figure 3:
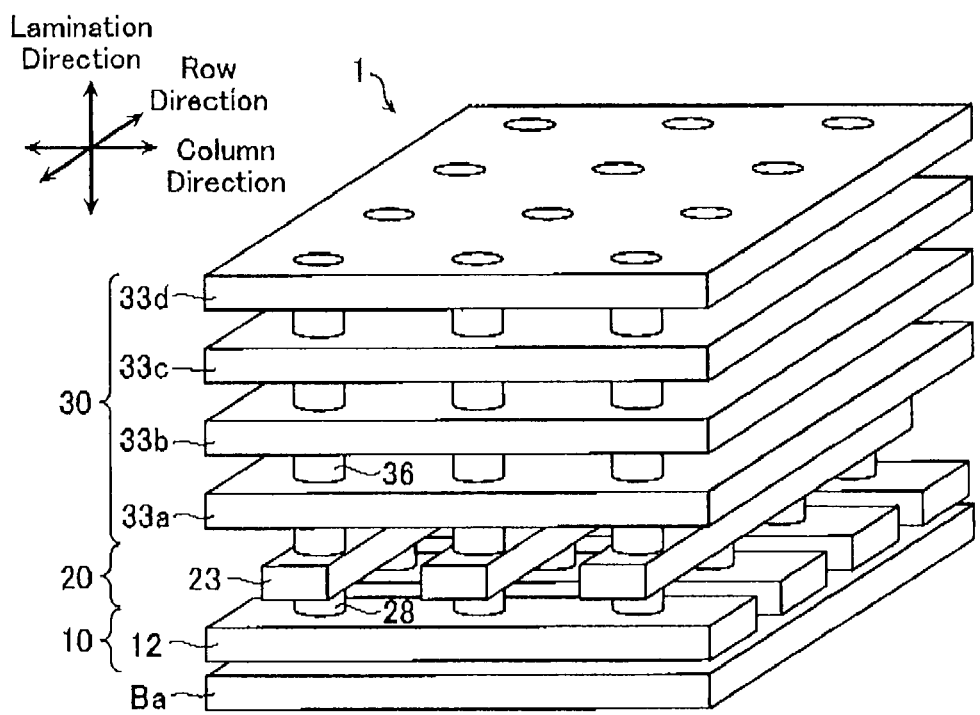
FIG. 3 is a perspective view schematically illustrating the memory element region 1.
Figure 4A:
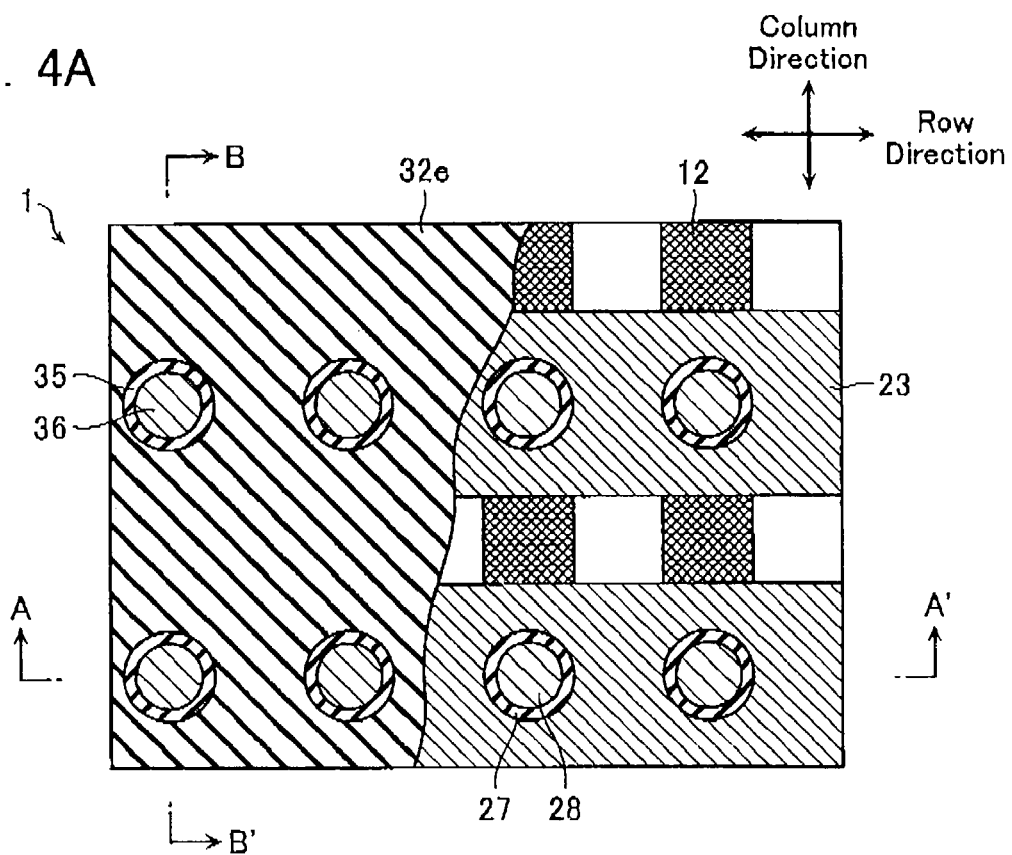
FIG. 4A is a top plan view of FIG. 3.
Figure 4B:
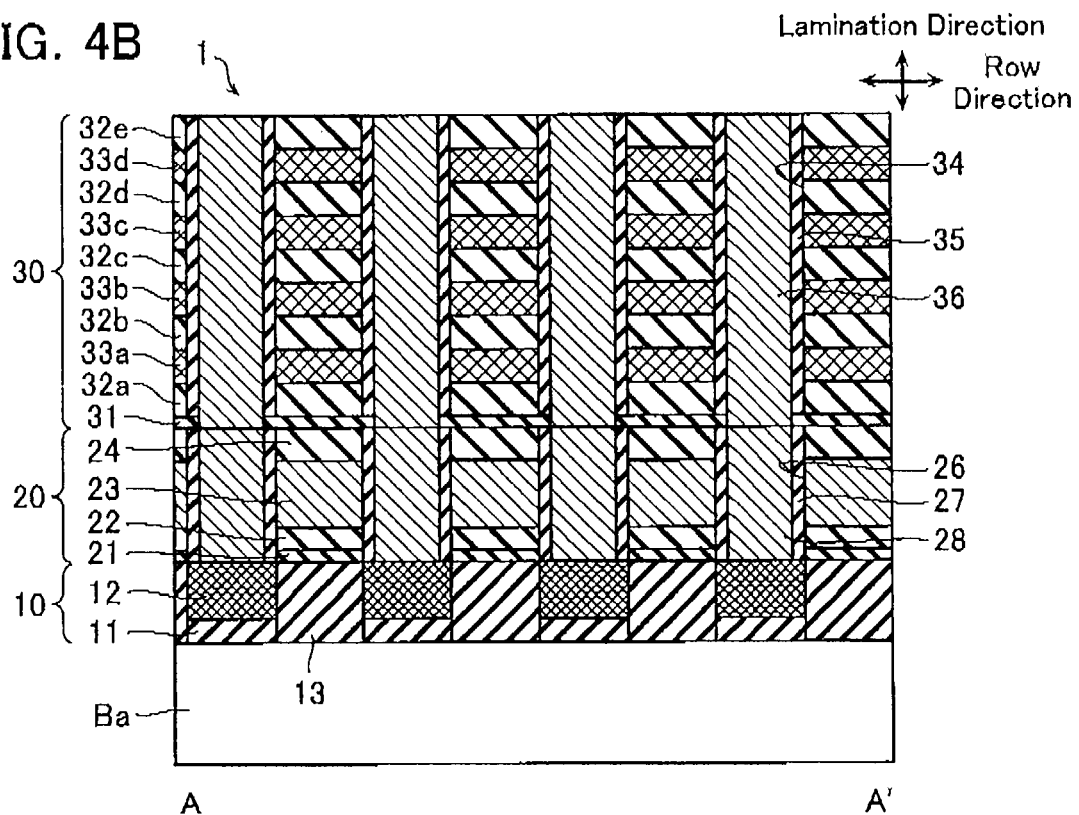
FIG. 4B is a cross-sectional view taken along line A-A' of FIG. 4A.
Figure 4C:
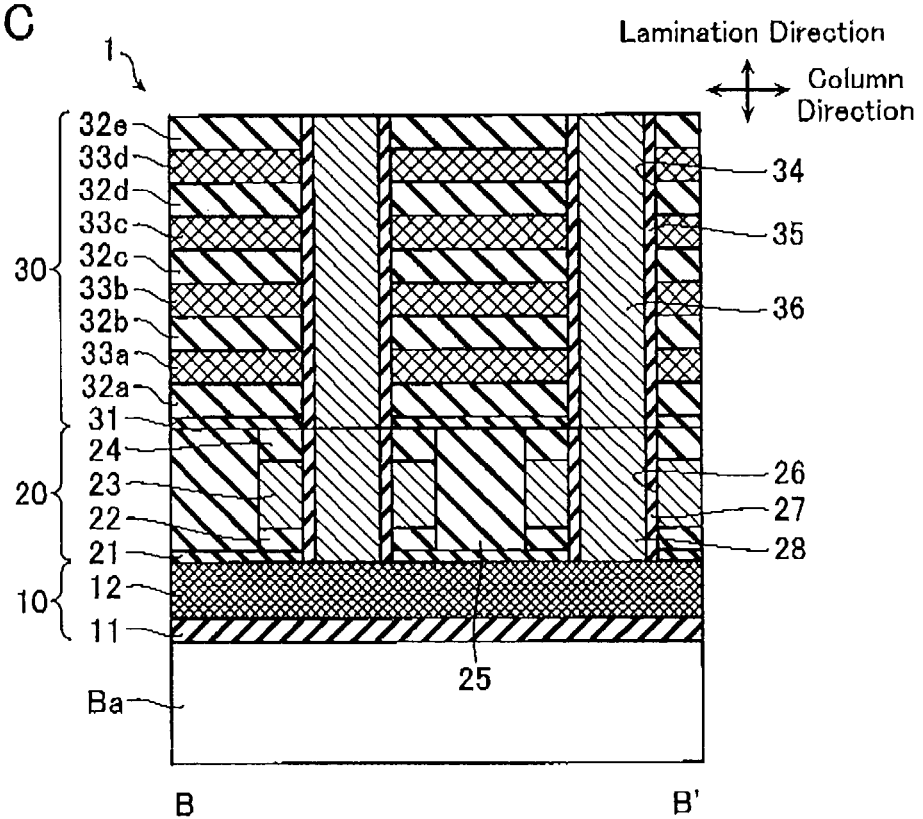
FIG. 4C is a cross-sectional view taken along line B-B' of FIG. 4A.

Referring now to FIG. 3 and FIGS. 4A to 4C, a specific configuration of the non-volatile semiconductor storage device 100 according to the first embodiment will be described below. FIG. 3 is a perspective view schematically illustrating the memory element region 1. FIG. 4A is a top plan view of FIG. 3; FIG. 4B is a cross-sectional view taken along line A-A' of FIG. 4A; and FIG. 4C is a cross-sectional view taken along line B-B' of FIG. 4A. Note that interlayer insulation layers between those layers that function as source lines SL (or bit lines BL or word lines WL) are omitted in FIG. 3. The right side of FIG. 4A illustrates the top surface of parts of a wiring layer 10 and a selection transistor layer 20 described below. In addition, the left side of FIG. 4A illustrates the top surface of a memory portion 30 described below.

As illustrated in FIGS. 3, 4B and 4C, the memory element region 1 has a wiring layer 10, a selection transistor layer 20, and a memory layer 30 that are sequentially laminated on a substrate Ba. The selection transistor layer 20 functions as selection transistors STr. The memory layer 30 functions as memory strings MS.

As illustrated in FIGS. 3, 4B and 4C, the wiring layer has first insulation layers 11 and bit-line conductive layers 12 that are sequentially laminated thereon.

The first insulation layers 11 are formed to extend in the column direction at a certain pitch in the row direction. The bit-line conductive layers 12 are formed on the first insulation layers 11 so as to extend in the column direction at a certain pitch in the row direction. Interlayer insulation layers 13 are formed between the respective sidewalls of the first insulation layers 11 and the bit-line conductive layers 12.

The first insulation layers 11 and the interlayer insulation layers 13 are formed of silicon oxide ($SiO_2$). The bit-line conductive layers 12 are formed of tungsten (W).

The bit-line conductive layers 12 function as the above-mentioned bit lines BL.

The selection transistor layer 20 has first protection layers 21, second insulation layers 22, word-line conductive layers 23, and third insulation layers 24 that are sequentially laminated thereon.

The first protection layers 21 are formed to expand in a two-dimensional manner within certain regions provided in the row and column directions. The second insulation layers 22, the word-line conductive layers 23, and the third insulation layers 24 are formed to extend in the row direction at a certain pitch in the column direction. Interlayer insulation layers 25 are formed on the respective sidewalls of the second insulation layers 22, the word-line conductive layers 23, and the third insulation layers 24.

The first protection layers 21 are formed of silicon nitride (SiN). The second insulation layers 22 and the third insulation layers 24 are formed of silicon oxide ($SiO_2$). The word-line conductive layers 23 are formed of polysilicon (p-Si) doped with $n^+$ type impurity ions ($n^+$ type semiconductors).

In addition, the selection transistor layer 20 has transistor holes 26.

The transistor holes 26 are formed to penetrate the first protection layers 21, the second insulation layers 22, the word-line conductive layers 23, and the third insulation layers 24. The transistor holes 26 are formed at positions matching the bit-line conductive layers 12. The transistor holes 26 are formed in a matrix form as viewed from above.

The selection transistor layer 20 also has selection gate insulation layers 27 and columnar layers 28.

The selection gate insulation layers 27 are formed with a certain thickness on respective sidewalls of the transistor holes 26. The columnar layers 28 are formed in columnar shapes extending in the lamination direction. The columnar layers 28 are formed in contact with the selection gate insulation layers 27 to fill up the transistor holes 26.

The selection gate insulation layers 27 are formed of silicon oxide ($SiO_2$). The columnar layers 28 are formed of polysilicon (p-Si) doped with $p^+$ type impurities ($p^+$ type semiconductors).

According to the configuration of the selection transistor layer 20 mentioned above, the word-line conductive layers 23 function as the above-mentioned word lines WL. In addition, the word-line conductive layers 23, the selection gate insulation layers 27, and the columnar layers 28 function as selection transistors STr. Moreover, respective ends of the word-line conductive layers 23 function as the control gates of the selection transistors STr. The columnar layers 28 function as the bodies of the selection transistors STr.

The memory layer 30 has second protection layers 31, fourth to eighth insulation layers 32a to 32e, and source-line conductive layers 33a to 33d.

The second protection layers 31, the fourth to eighth insulation layers 32a to 32e, and the first to fourth source-line conductive layers 33a to 33d are formed to expand in a two-dimensional manner within certain regions provided in the row and column directions. The fourth to eighth insulation layers 32a to 32e are formed above the second protection layers 31. The first to fourth source-line conductive layers 33a to 33d are formed between the fourth to eighth insulation layers 32a to 32e.

The second protection layers 31 are formed of silicon nitride (SiN). The fourth to eighth insulation layers 32a to 32e are formed of silicon oxide ($SiO_2$). The first to fourth source-line conductive layers 33a to 33d include metal layers. The first to fourth source-line conductive layers 33a to 33d are formed of, e.g., any one of TiB, TaB, HfSix, TiN, and Ta.

The memory layer 30 also has memory holes 34.

The memory holes 34 are formed to penetrate the second protection layers 31, the fourth to eighth insulation layers 32a to 32e, and the first to fourth source-line conductive layers 33a to 33d. The memory holes 34 are formed at positions matching the transistor holes 26. The memory holes 34 are formed in a matrix form as viewed from above.

The memory layer 30 also has memory gate insulation layers 35 and columnar layers 36.

The memory gate insulation layers 35 are formed with a certain thickness on respective sidewalls of the memory holes 34. The columnar layers 36 are formed in columnar shapes extending in the lamination direction. The columnar layers 36 are formed in contact with the memory gate insulation layers 35 to fill up the memory holes 34.

The memory gate insulation layers 35 are formed of, e.g., silicon oxide ($SiO_2$). The memory gate insulation layers 35 are configured to change their resistance values when they are broken down with a certain voltage applied thereto. That is, they are configured to change the resistance depending upon the applied voltage. The columnar layers 36 are formed of polysilicon (p-Si) doped with p-type impurity ions (p-type semiconductors). The columnar layers 36 are formed of semiconductor having such a impurity concentration that the first to fourth source-line conductive layers 33a to 33d and the semiconductor configure the Schottky diodes SBD. Specifically, the Schottky diodes SBD have respective anodes at the columnar layers 36 side, and respective cathodes at the first to fourth source-line conductive layers 33a to 33d side.

According to the configuration of the memory layer mentioned above, the first to fourth source-line conductive layers 33a to 33d function as source lines SL (SL1 to SL4). In addition, the first to fourth source-line conductive layers 33a to 33d, the memory gate insulation layers 35, and the columnar layers 36 function as memory strings MS (memory elements MC1 to MC4). The memory gate insulation layers 35 function as resistance-change elements R. The first to fourth source-line conductive layers 33a to 33d and the columnar layers 36 function as Schottky diodes SBD.

(Manufacturing Method of Non-Volatile) Semiconductor Storage Device 100 in First Embodiment Referring now to FIGS. 5A (5B, 5C) to 16A (16B, 16C), a method of manufacturing the non-volatile semiconductor storage device 100 according to the first embodiment will be described below. Figures A of FIGS. 5 through 16 are top plan views, each illustrating a manufacturing process of the non-volatile semiconductor storage device 100 of the first embodiment. Figures B of FIGS. 5 through 16 are cross-sectional views taken along line A-A' of the figures A of FIGS. 5 through 16; and figures C of FIGS. 5 through 16 are cross-sectional views taken along line B-B' of the figures A of FIGS. 5 through 16.

Figure 5A:
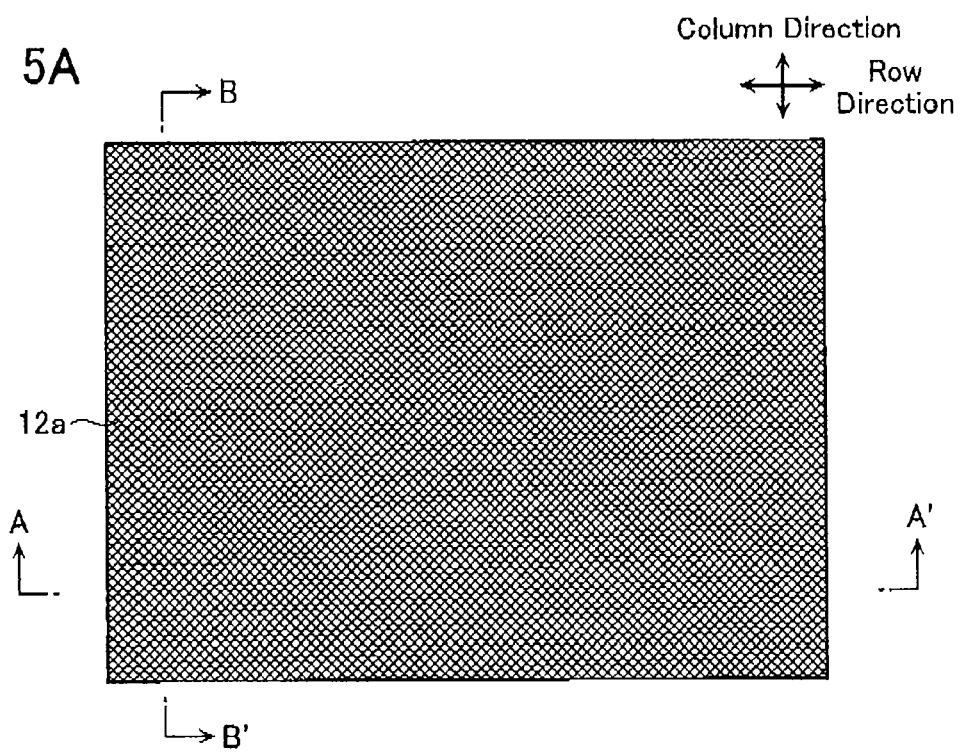
FIG. 5A is a top plan view illustrating a manufacturing process of the non-volatile semiconductor storage device 100 of the first embodiment.
Figure 5B:
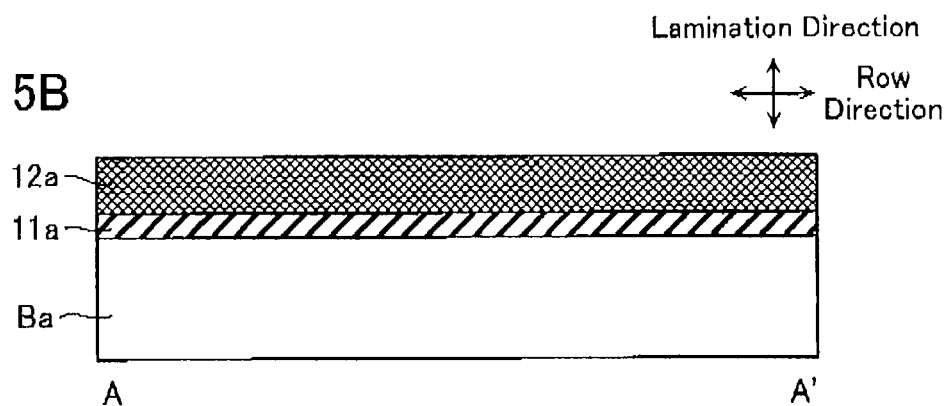
FIG. 5B is a cross-sectional view taken along line A-A' of FIG. 5A.
Figure 5C:
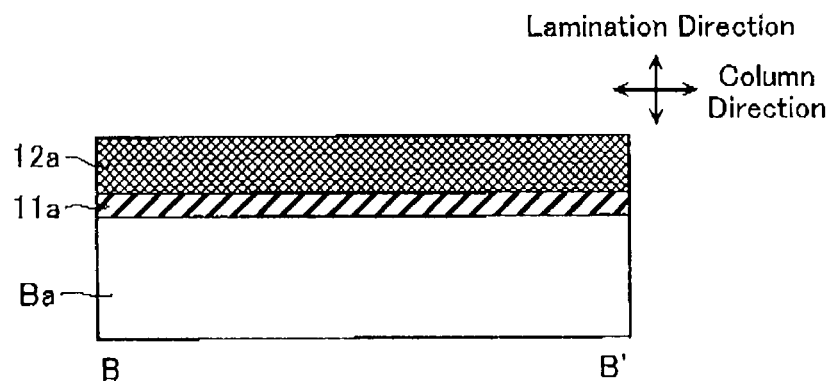
FIG. 5C is a cross-sectional view taken along line B-B' of FIG. 5A.

Firstly, as illustrated in FIGS. 5A to 5C, silicon oxide ($SiO_2$) and tungsten (W) are deposited on the substrate Ba to form layers 11a and 12a.

Figure 6A:
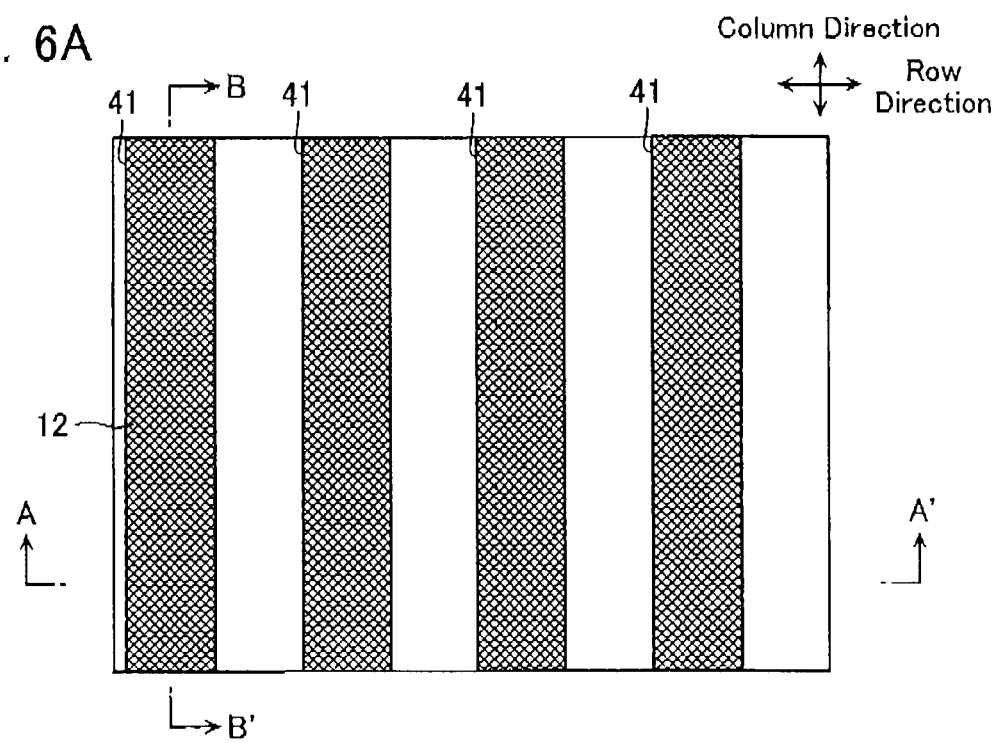
FIG. 6A is a top plan view illustrating the manufacturing process of the non-volatile semiconductor storage device 100 of the first embodiment.
Figure 6B:
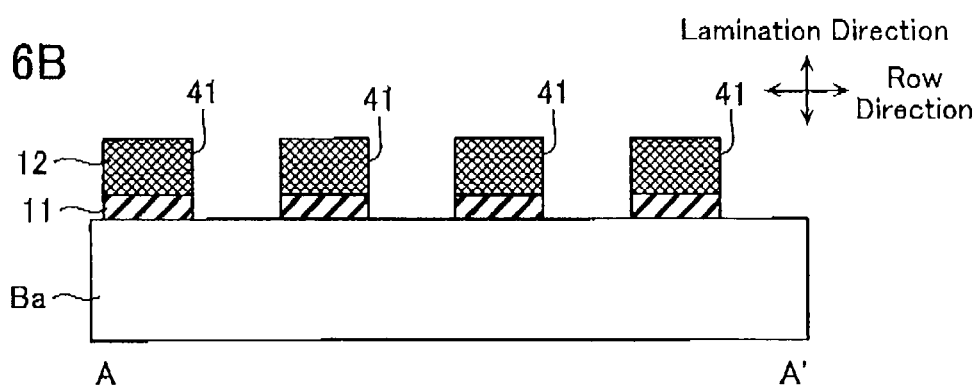
FIG. 6B is a cross-sectional view taken along line A-A' of FIG. 6A.
Figure 6C:
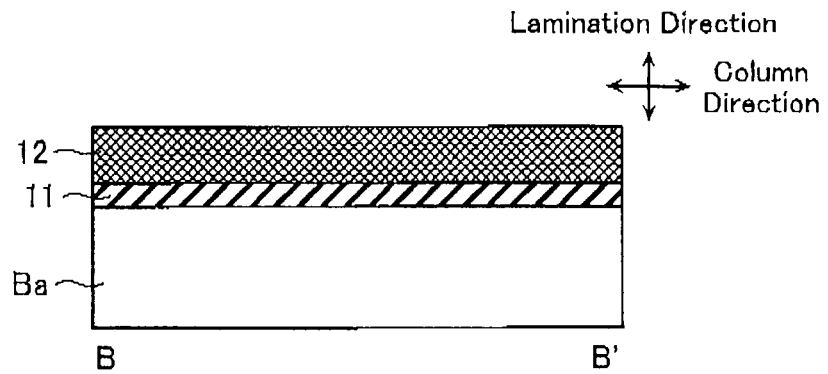
FIG. 6C is a cross-sectional view taken along line B-B' of FIG. 6A.

Then, as illustrated in FIGS. 6A to 6C, trenches 41 are formed to penetrate the layers 11a and 12a. The trenches 41 are formed to extend in the column direction at a certain pitch in the row direction. Through this process, the layer 11a provides a first insulation layer 11. In addition, the layer 12a provides a bit-line conductive layer 12.

Figure 7A:
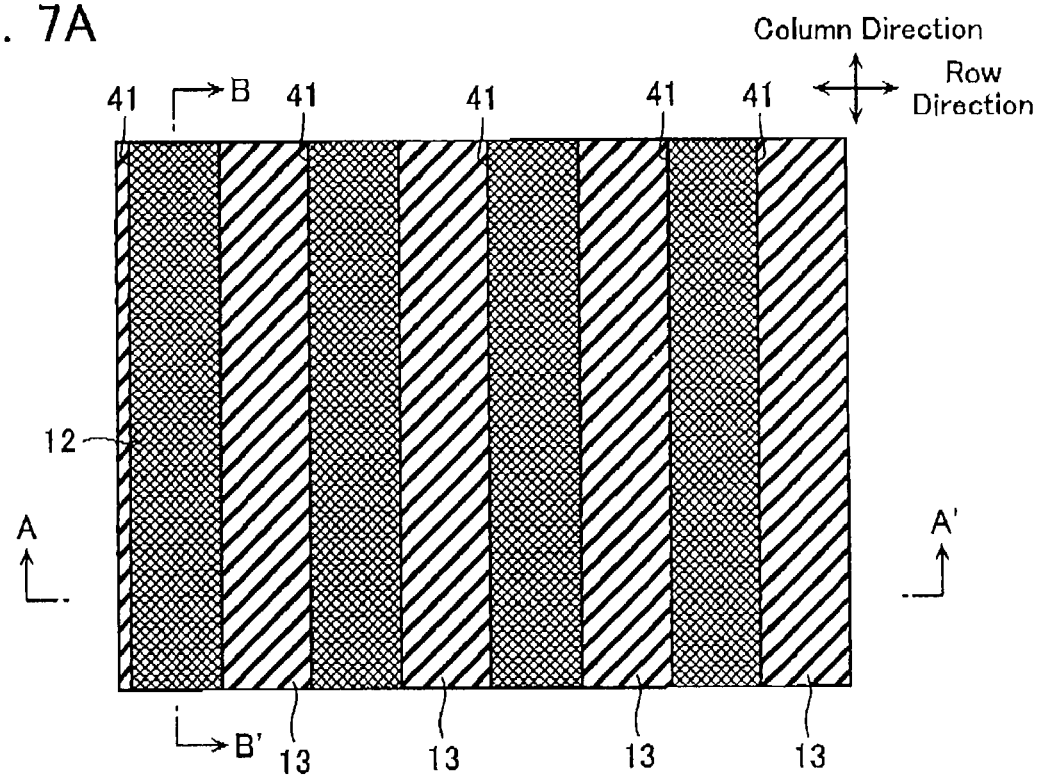
FIG. 7A is a top plan view illustrating the manufacturing process of the non-volatile semiconductor storage device 100 of the first embodiment.
Figure 7B:
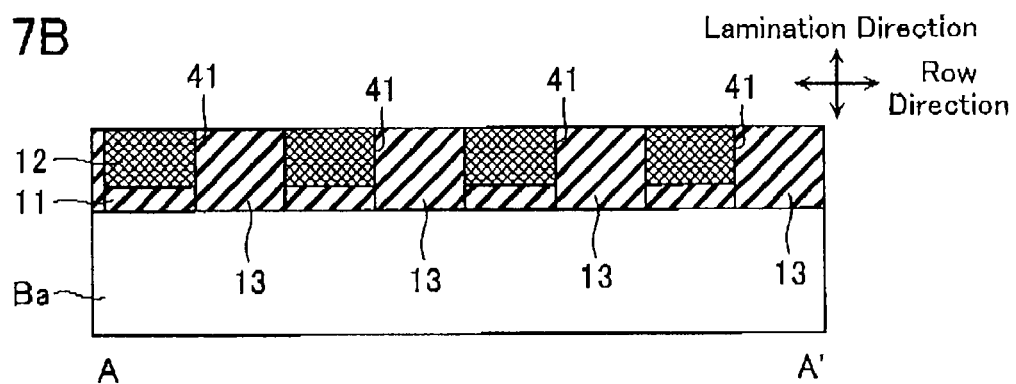
FIG. 7B is a cross-sectional view taken along line A-A' of FIG. 7A.
Figure 7C:
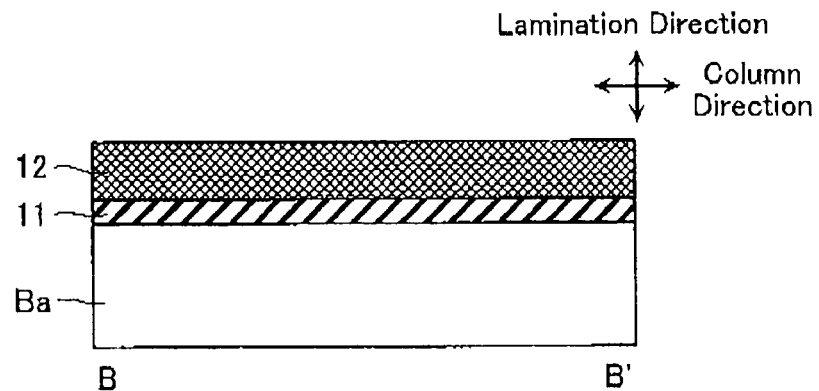
FIG. 7C is a cross-sectional view taken along line B-B' of FIG. 7A.

Subsequently, as illustrated in FIGS. 7A to 7C, silicon oxide ($SiO_2$) is deposited to fill up the trenches 41. Thereafter, planarization is performed thereon with CMP (Chemical Mechanical Polishing), and so on, thereby forming interlayer insulation layers 13.

Figure 8A:
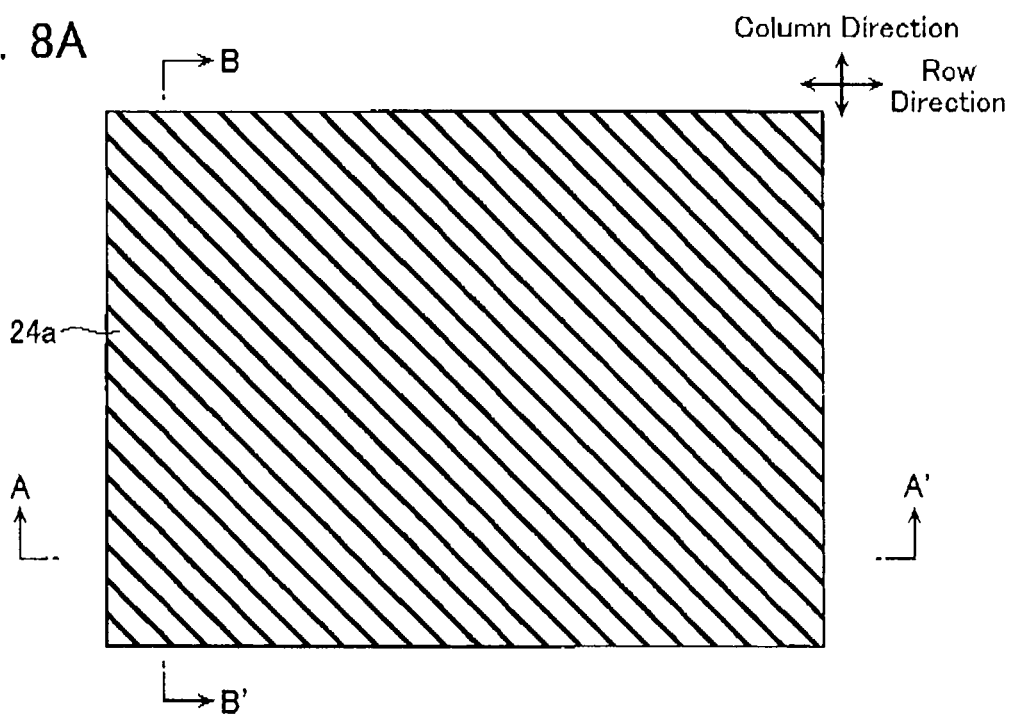
FIG. 8A is a top plan view illustrating the manufacturing process of the non-volatile semiconductor storage device 100 of the first embodiment.
Figure 8B:
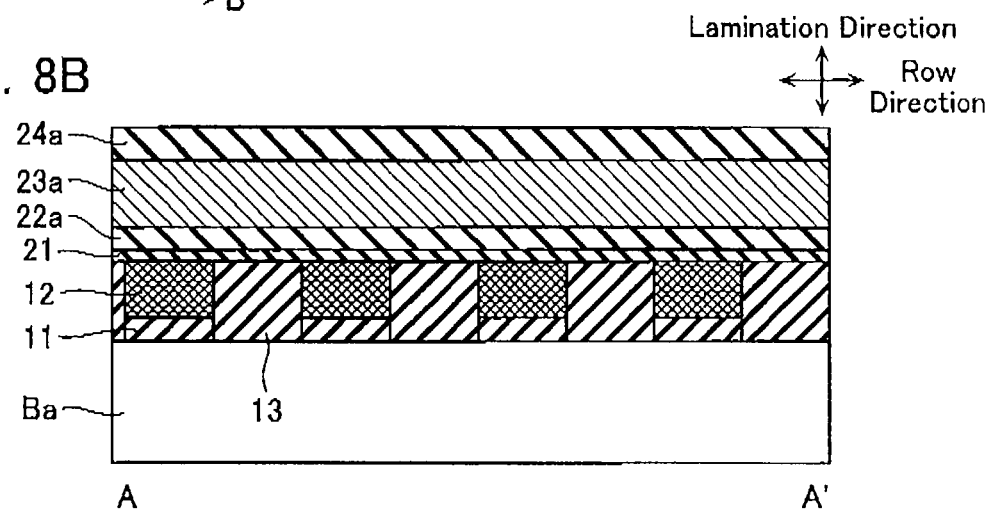
FIG. 8B is a cross-sectional view taken along line A-A' of FIG. 8A.
Figure 8C:
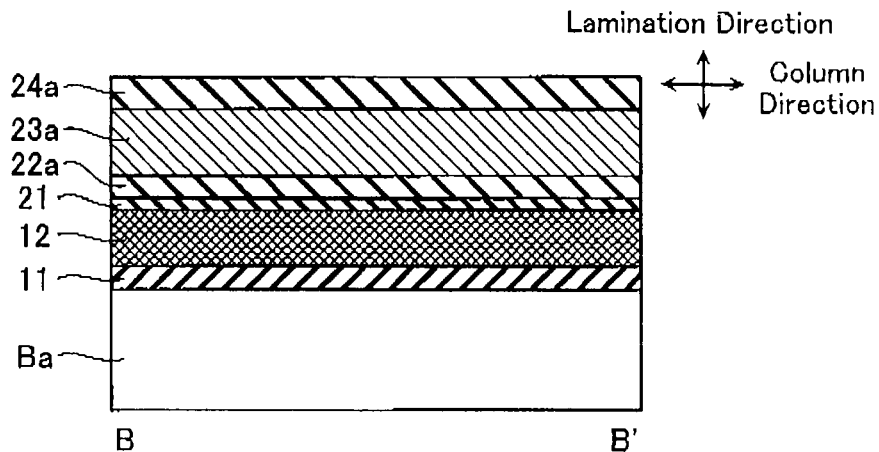
FIG. 8C is a cross-sectional view taken along line B-B' of FIG. 8A.

Then, as illustrated in FIGS. 8A to 8C, silicon nitride (SiN) (e.g., 15 nm), silicon oxide ($SiO_2$) (e.g., 20 nm), $n^+$ type polysilicon (p-Si) (e.g., 200 nm), silicon oxide ($SiO_2$) (e.g., 20 nm) are sequentially deposited on the top surfaces of the bit-line conductive layers 12 (interlayer insulation layers 13). Through this process, a first protection layer 21 and other layers 22a, 23a and 24a are formed on the top surfaces of the bit-line conductive layers 12 (interlayer insulation layers 13).

Figure 9A:
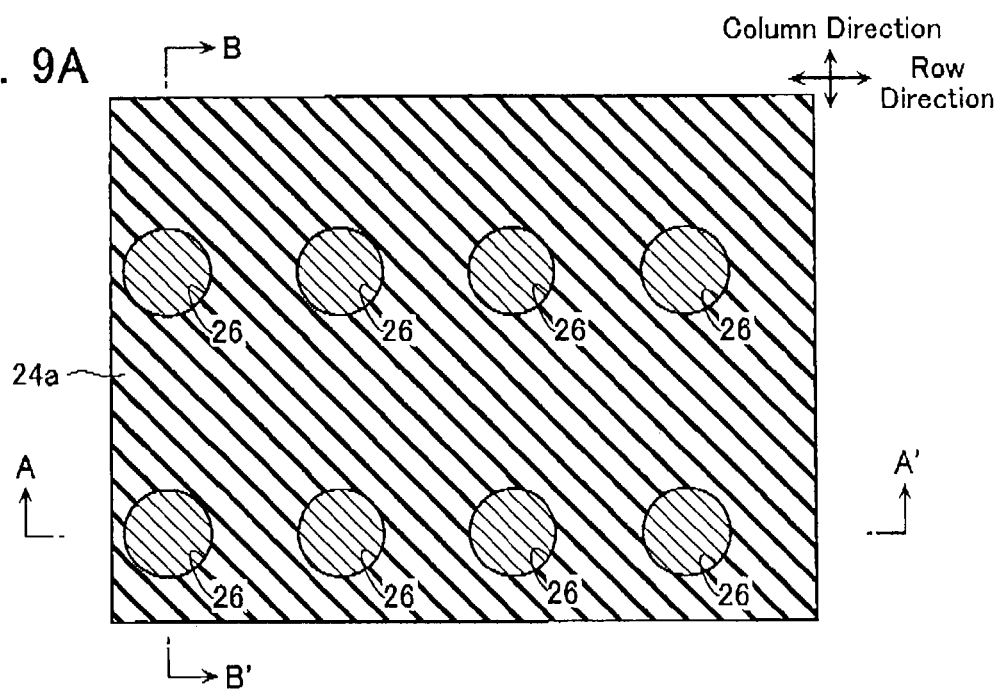
FIG. 9A is a top plan view illustrating the manufacturing process of the non-volatile semiconductor storage device 100 of the first embodiment.
Figure 9B:
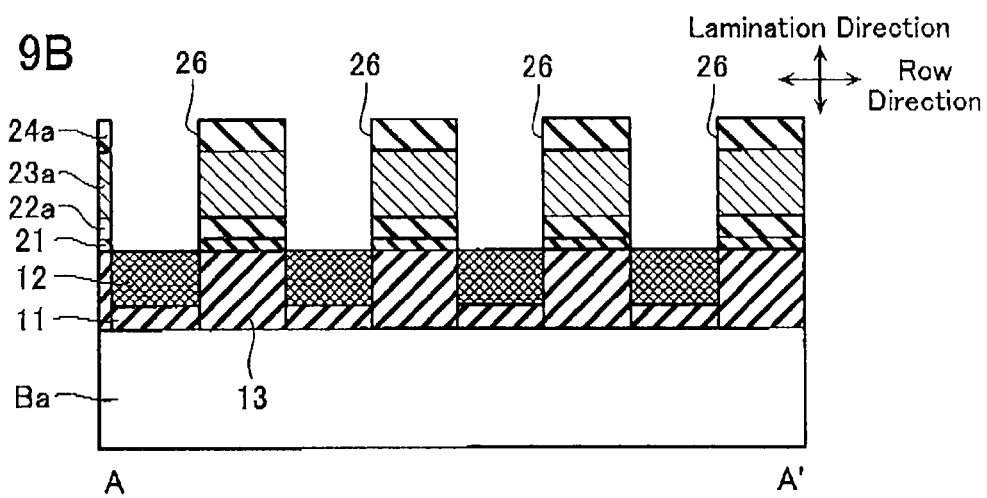
FIG. 9B is a cross-sectional view taken along line A-A' of FIG. 9A.
Figure 9C:
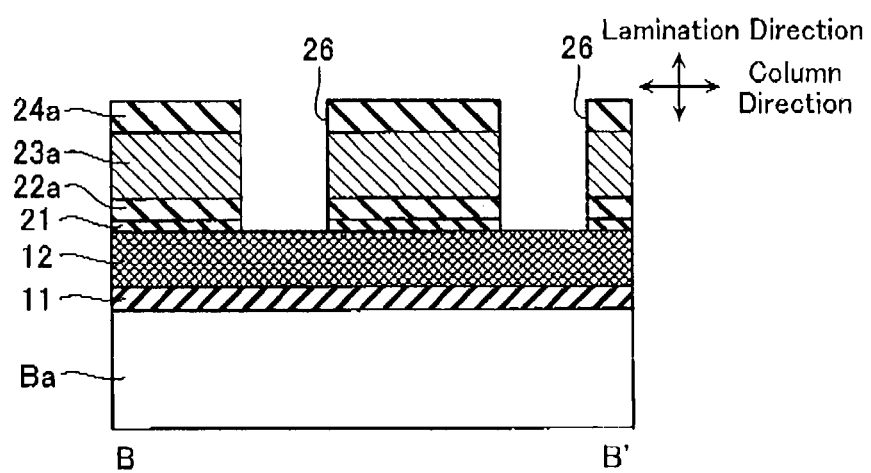
FIG. 9C is a cross-sectional view taken along line B-B' of FIG. 9A.

Subsequently, as illustrated in FIGS. 9A to 9C, transistor holes 26 are formed to penetrate the first protection layers 21 as well as the layers 22a, 23a and 24a. The transistor holes 26 are formed at positions matching the bit-line conductive layers 12. The transistor holes 26 are formed to be arranged in a matrix form as viewed from above.

Figure 10A:
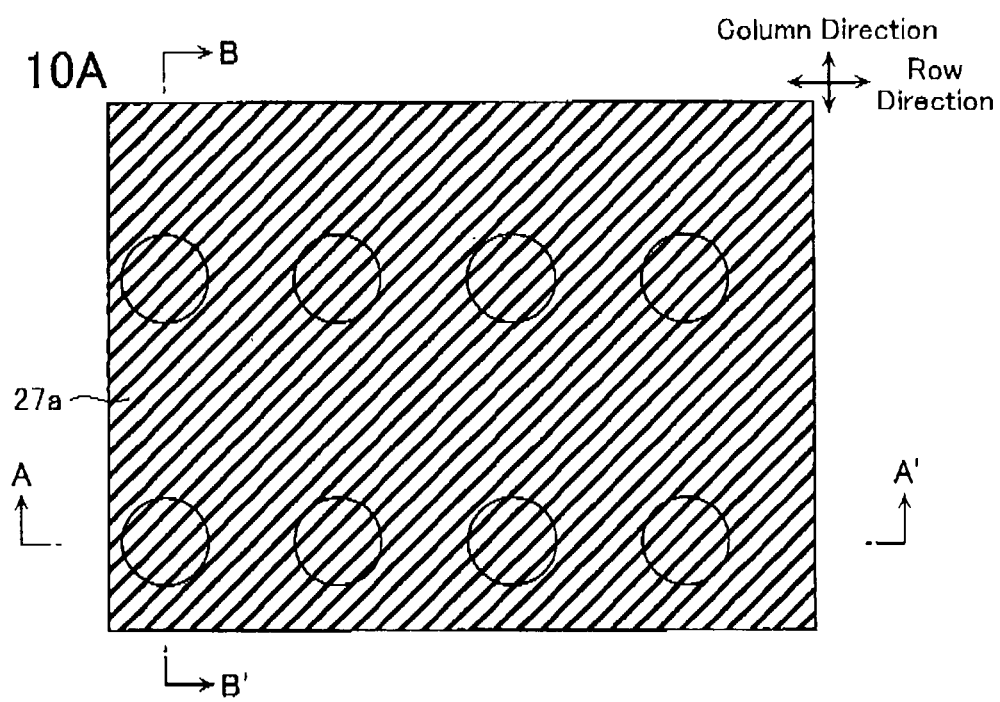
FIG. 10A is a top plan view illustrating the manufacturing process of the non-volatile semiconductor storage device 100 of the first embodiment.
Figure 10B:
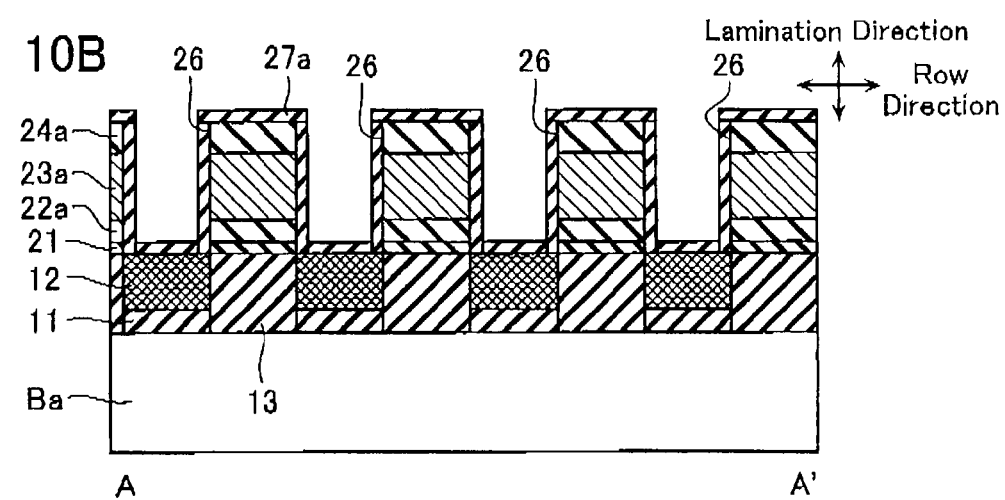
FIG. 10B is a cross-sectional view taken along line A-A' of FIG. 10A.
Figure 10C:
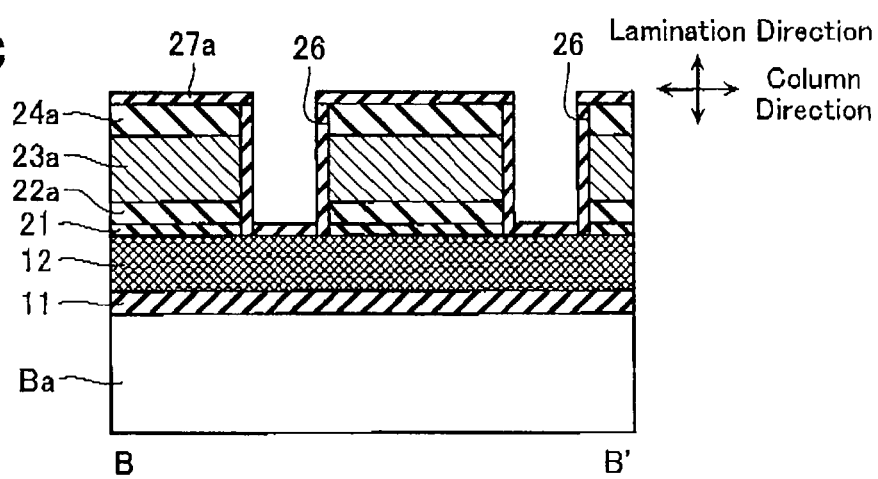
FIG. 10C is a cross-sectional view taken along line B-B' of FIG. 10A.

Then, as illustrated in FIGS. 10A to 10C, silicon oxide ($SiO_2$) (2 to 3 nm) is deposited over the surfaces facing the transistor holes 26 as well as over the top surfaces of the layers 24a with CVD (Chemical Vapor Deposition), thereby forming a layer 27a.

Figure 11A:
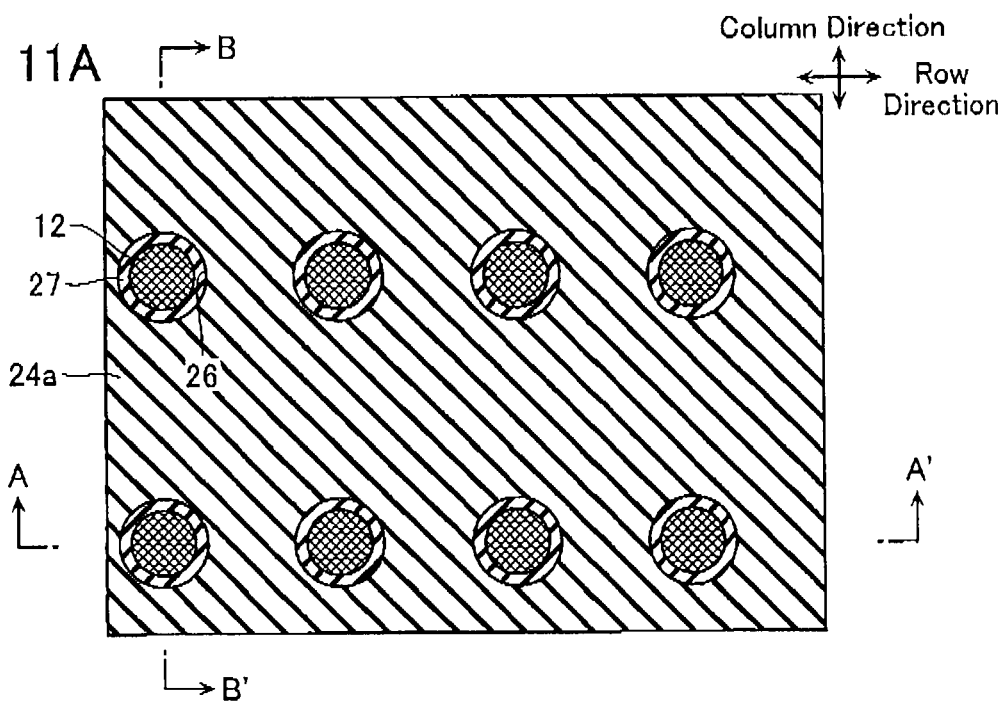
FIG. 11A is a top plan view illustrating the manufacturing process of the non-volatile semiconductor storage device 100 of the first embodiment.
Figure 11B:
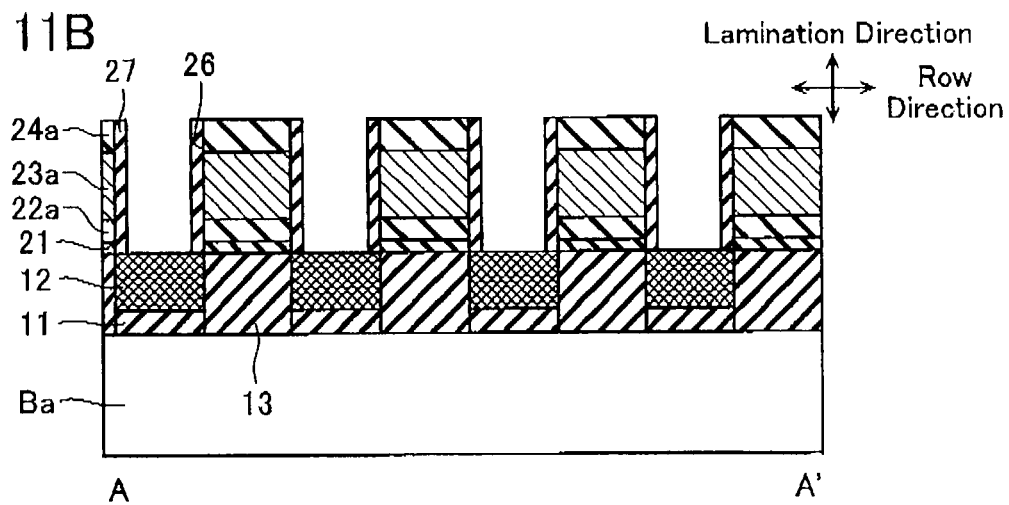
FIG. 11B is a cross-sectional view taken along line A-A' of FIG. 11A.
Figure 11C:
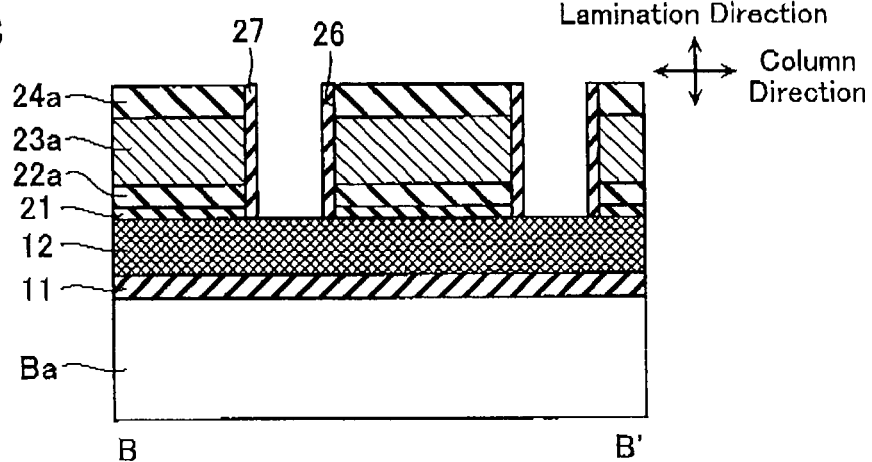
FIG. 11C is a cross-sectional view taken along line B-B' of FIG. 11A.

Subsequently, as illustrated in FIGS. 11A to 11C, those portions of the layer 27a are selectively etched and removed that are located on the surfaces facing the transistor holes 26 and on the top surfaces of the layers 24a. Through this process, selection gate insulation layers 27 are formed.

Figure 12A:
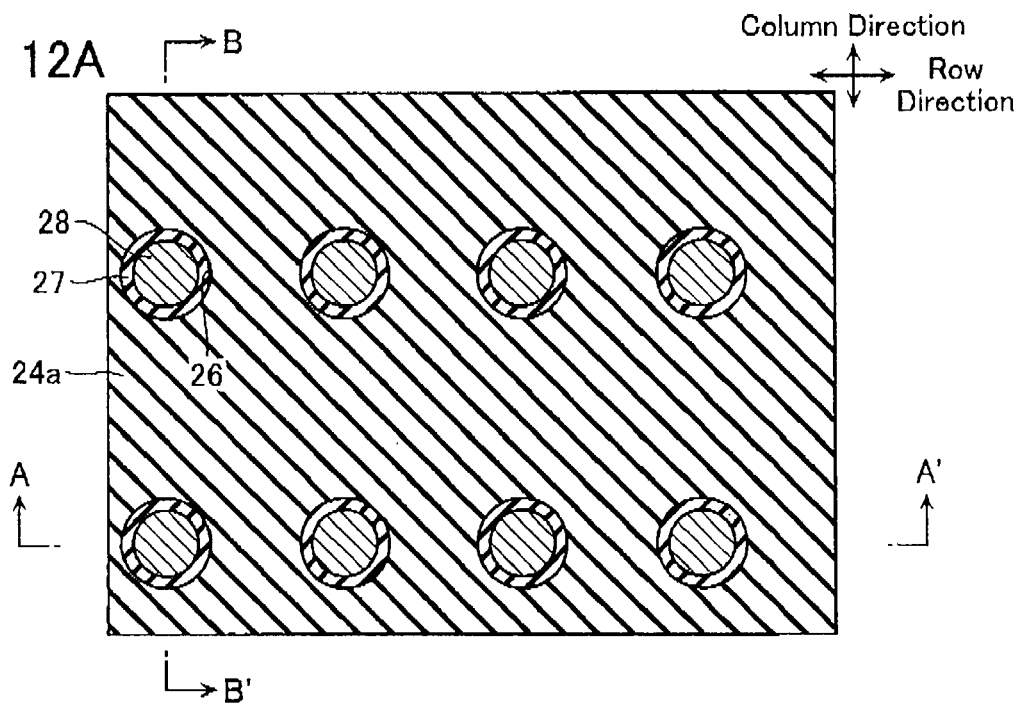
FIG. 12A is a top plan view illustrating the manufacturing process of the non-volatile semiconductor storage device 100 of the first embodiment.
Figure 12B:
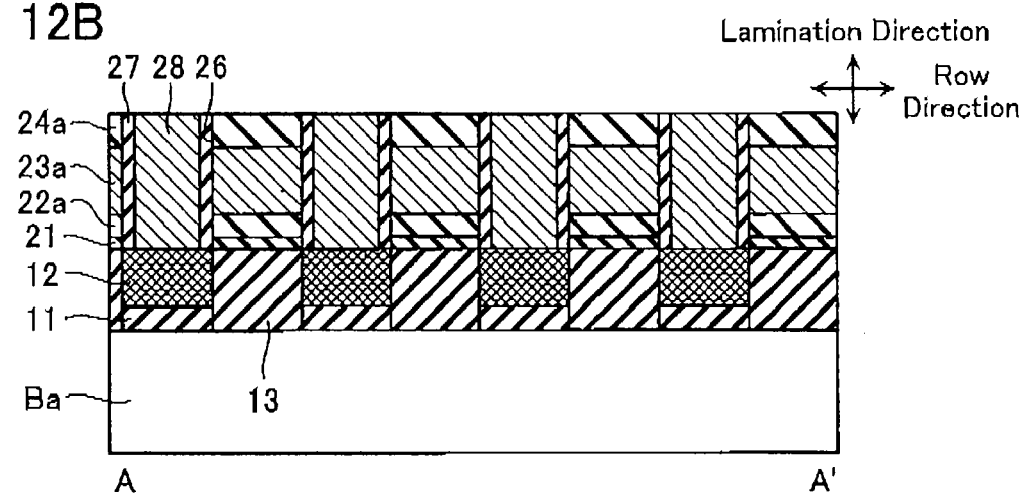
FIG. 12B is a cross-sectional view taken along line A-A' of FIG. 12A.
Figure 12C:
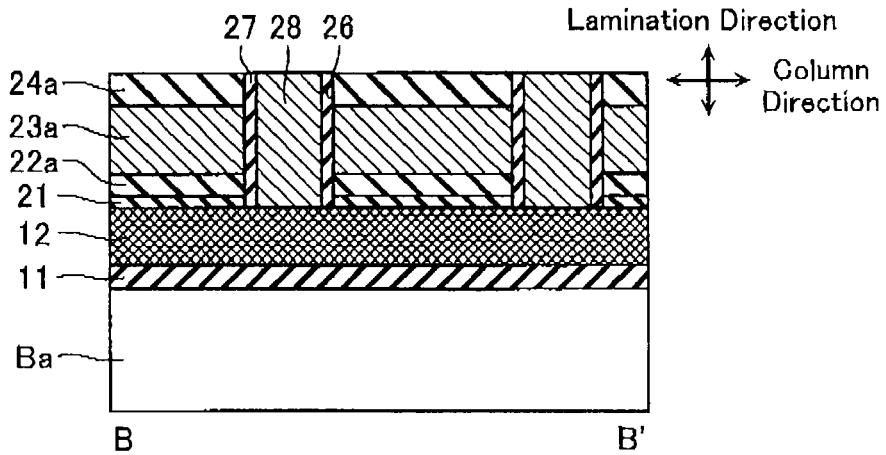
FIG. 12C is a cross-sectional view taken along line B-B' of FIG. 12A.

Then, as illustrated in FIGS. 12A to 12C, $p^+$ type polysilicon (p-Si) is deposited to fill up the transistor holes 26, and etch-back is performed thereafter. Through this process, columnar layers 28 are formed.

Figure 13A:
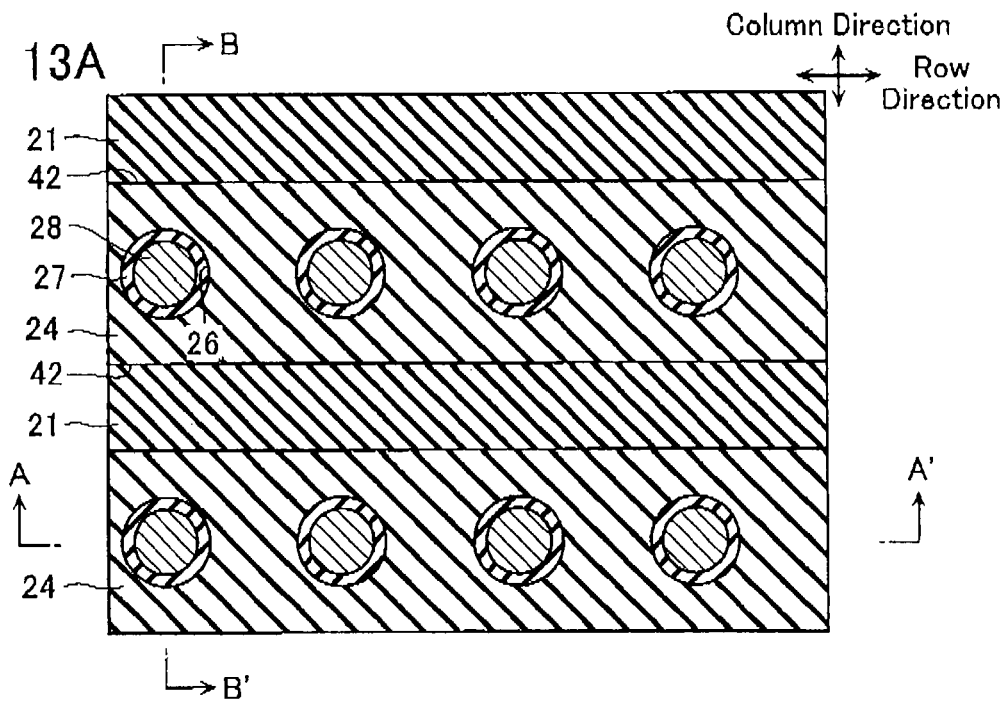
FIG. 13A is a top plan view illustrating the manufacturing process of the non-volatile semiconductor storage device 100 of the first embodiment.
Figure 13B:
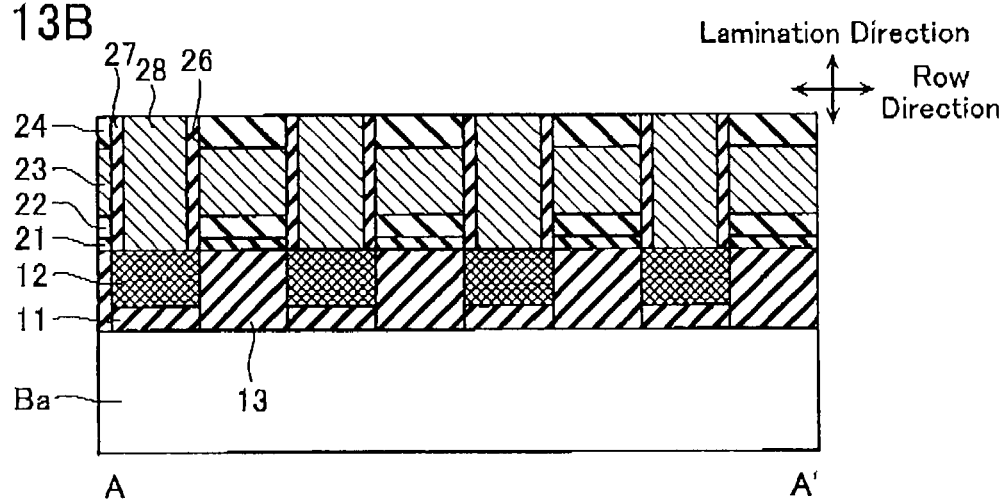
FIG. 13B is a cross-sectional view taken along line A-A' of FIG. 13A.
Figure 13C:
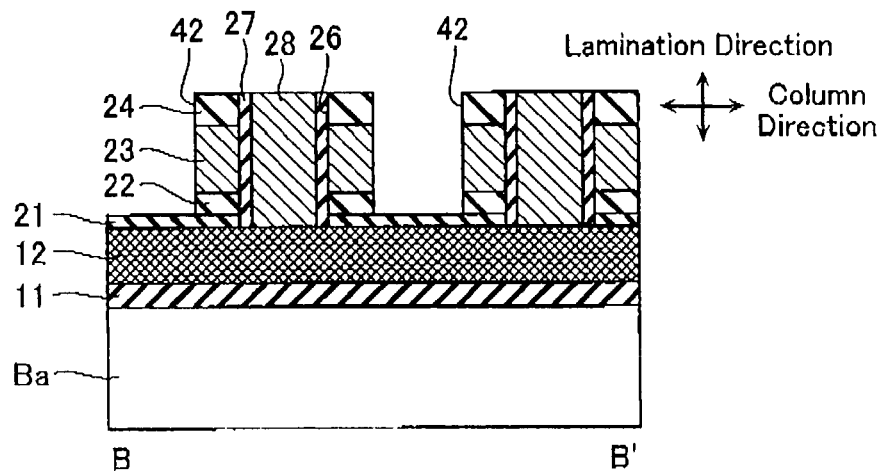
FIG. 13C is a cross-sectional view taken along line B-B' of FIG. 13A.

Subsequently, as illustrated in FIGS. 13A to 13C, trenches 42 are formed to penetrate the layers 22a to 24a. The trenches 42 are formed to extend in the row direction at a certain pitch in the column direction. Through this process, the layers 22a provide second insulation layers 22. The layers 23a provide word-line conductive layers 23. The layers 24a provide third insulation layers 24.

Figure 14A:
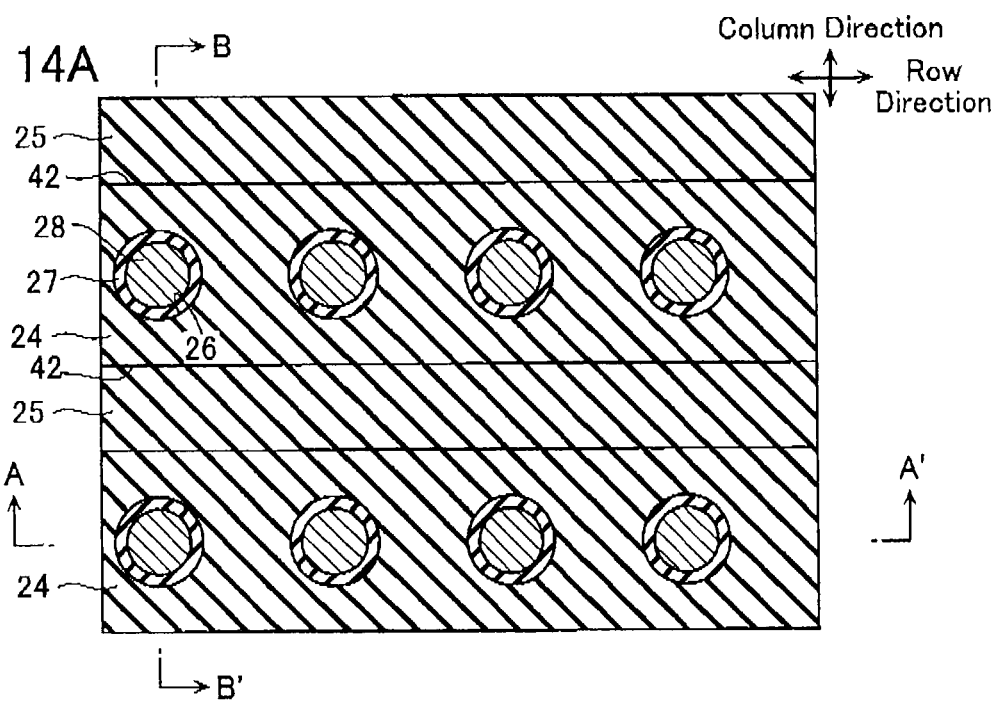
FIG. 14A is a top plan view illustrating the manufacturing process of the non-volatile semiconductor storage device 100 of the first embodiment.
Figure 14B:
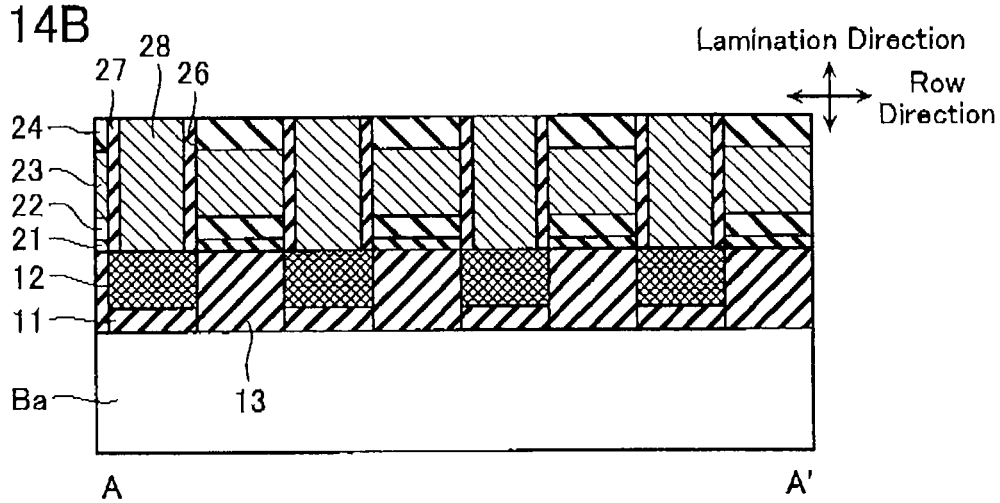
FIG. 14B is a cross-sectional view taken along line A-A' of FIG. 14A.
Figure 14C:
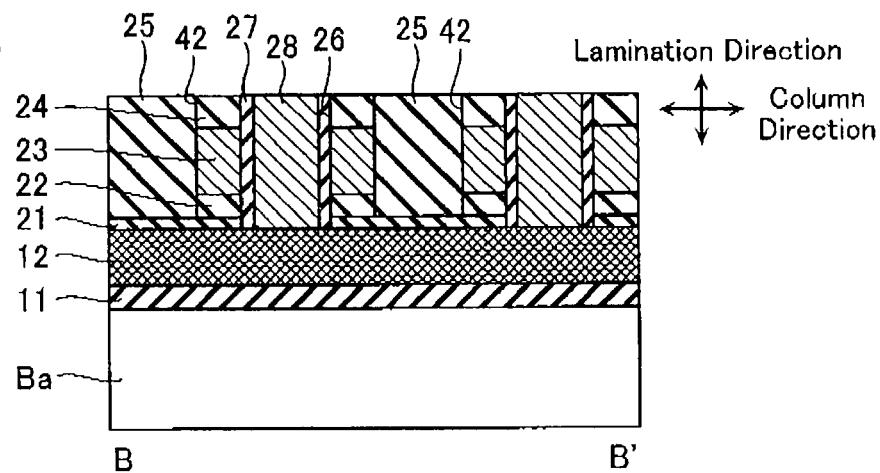
FIG. 14C is a cross-sectional view taken along line B-B' of FIG. 14A.

Then, as illustrated in FIGS. 14A to 14C, silicon oxide ($SiO_2$) is deposited to fill up the trenches 42. Thereafter, planarization is performed thereon with CMP, and so on, thereby forming interlayer insulation layers 25.

Figure 15A:
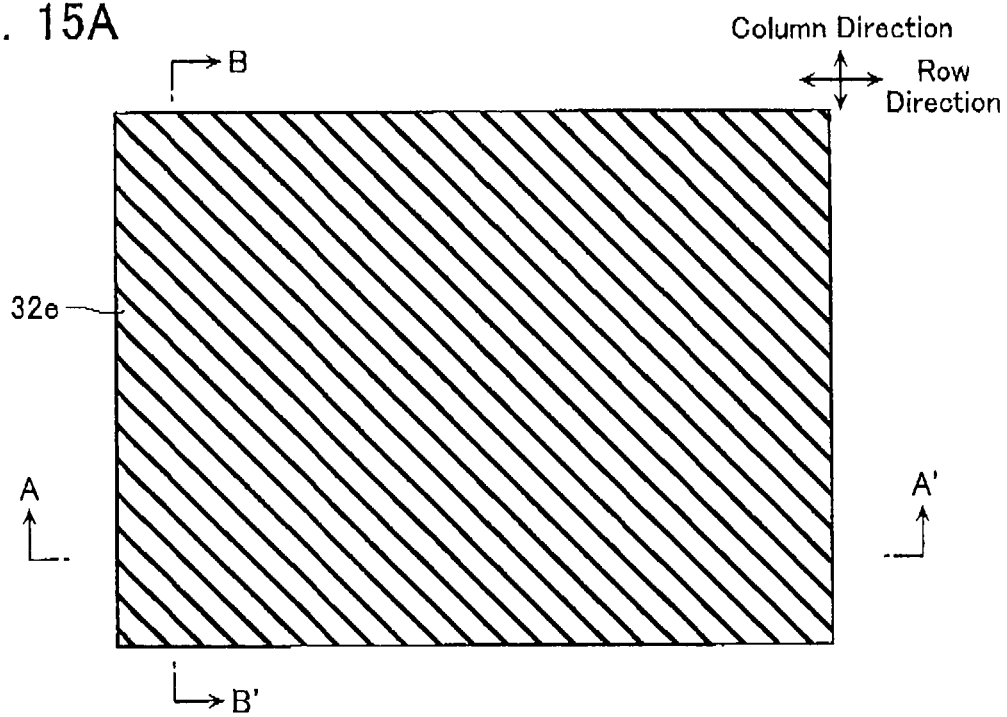
FIG. 15A is a top plan view illustrating the manufacturing process of the non-volatile semiconductor storage device 100 of the first embodiment.
Figure 15B:
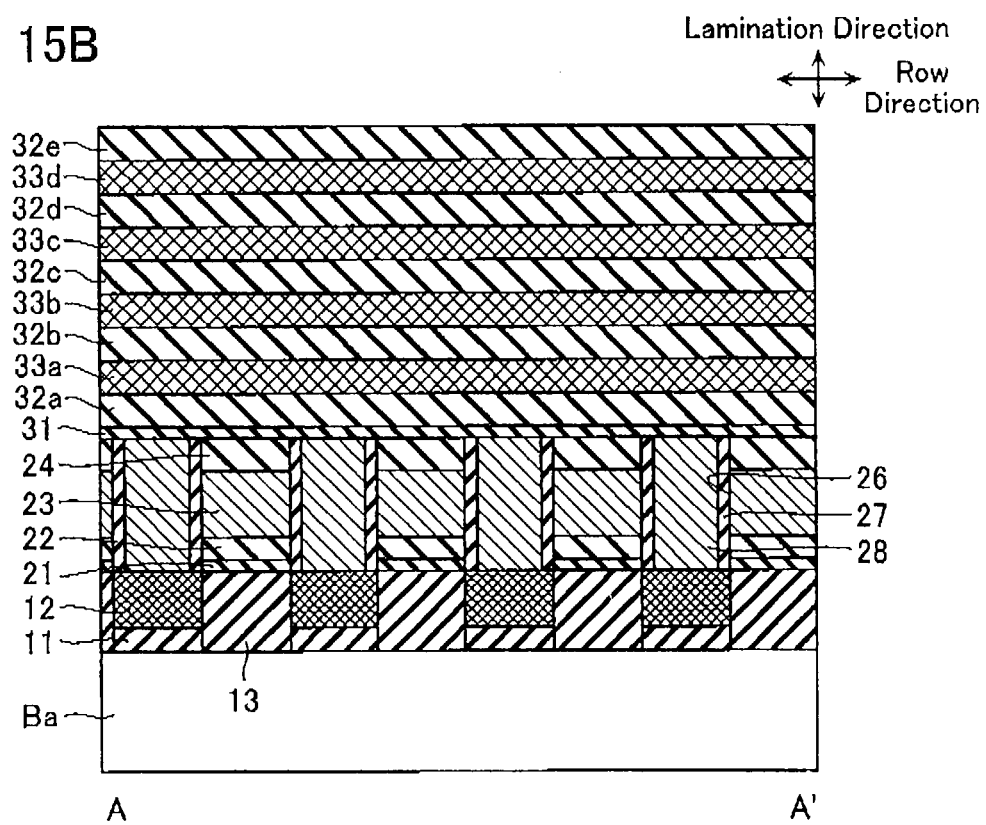
FIG. 15B is a cross-sectional view taken along line A-A' of FIG. 15A.
Figure 15C:
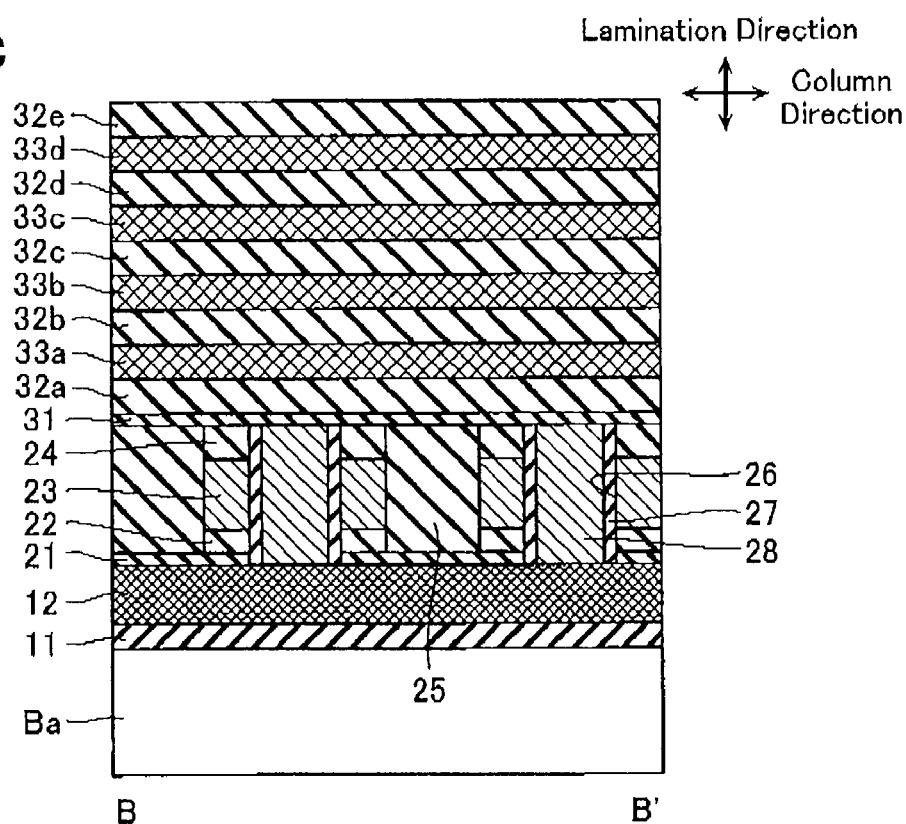
FIG. 15C is a cross-sectional view taken along line B-B' of FIG. 15A.

Subsequently, as illustrated in FIGS. 15A to 15C, silicon nitride (SiN) is deposited with CVD to form second protection layers 31. Then, silicon oxide ($SiO_2$) and metal layer (any one of TiB, TaB, HfSix, TiN, and Ta) are sequentially laminated on the second protection layers 31 with CVD to form fourth to eighth insulation layers 32a to 32e and first to fourth source-line conductive layers 33a to 33d.

Figure 16A:
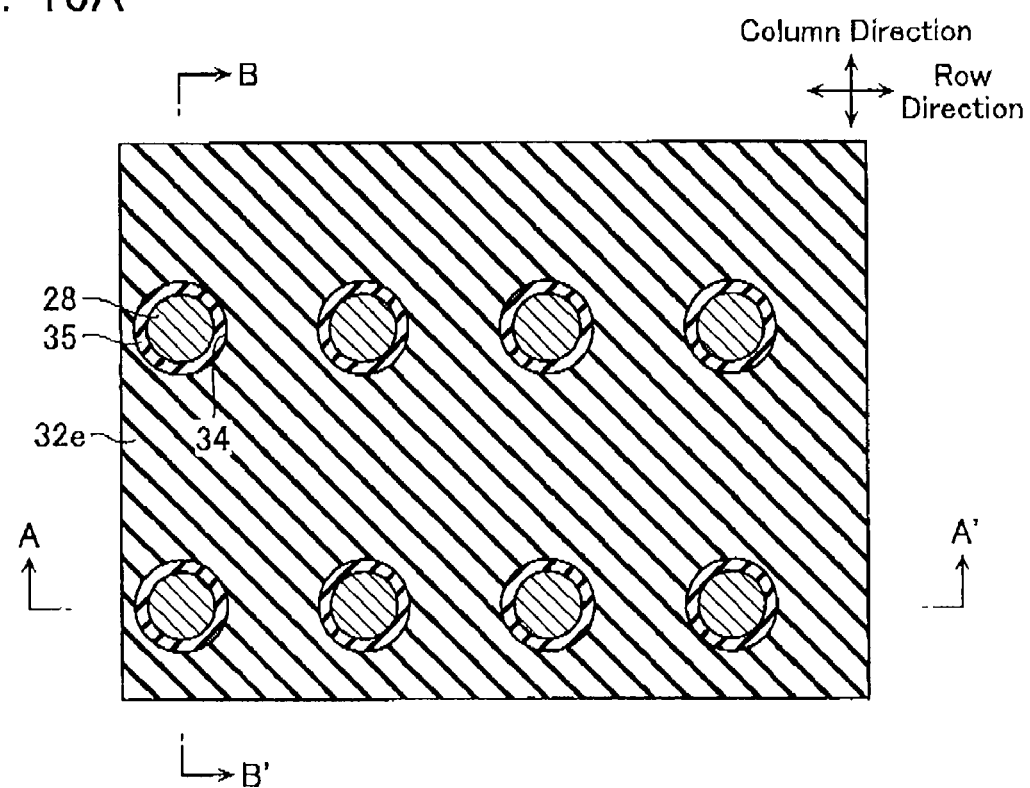
FIG. 16A is a top plan view illustrating the manufacturing process of the non-volatile semiconductor storage device 100 of the first embodiment.
Figure 16B:
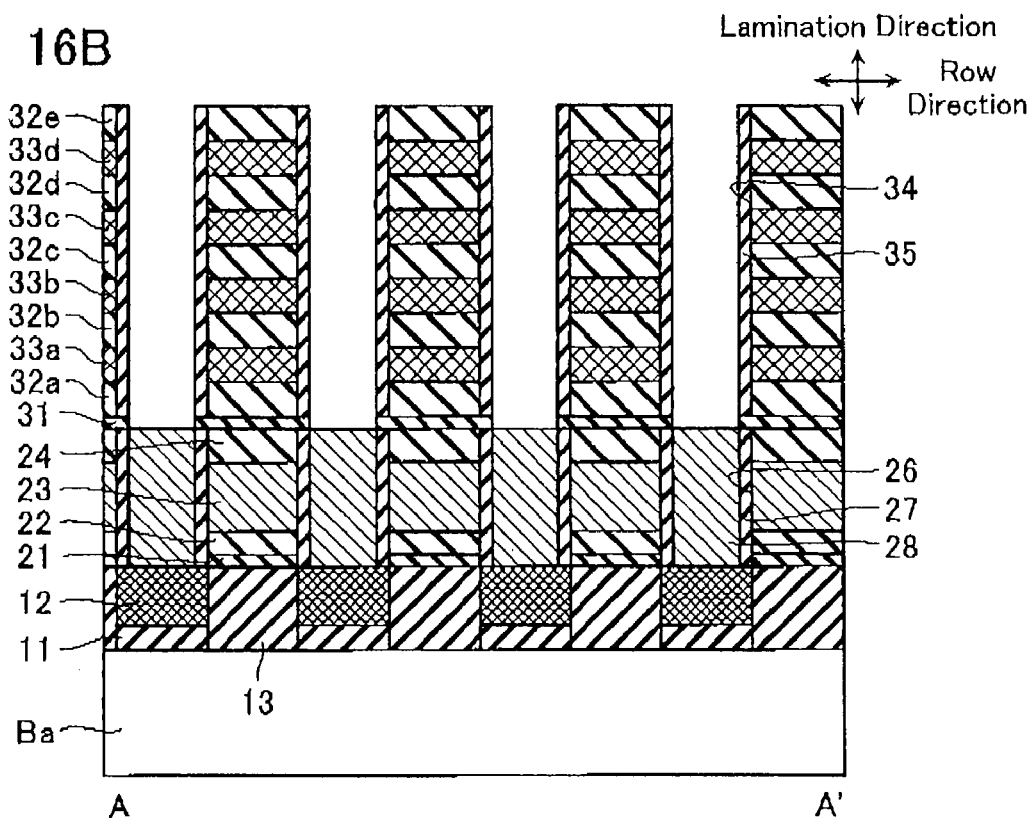
FIG. 16B is a cross-sectional view taken along line A-A' of FIG. 16A.
Figure 16C:
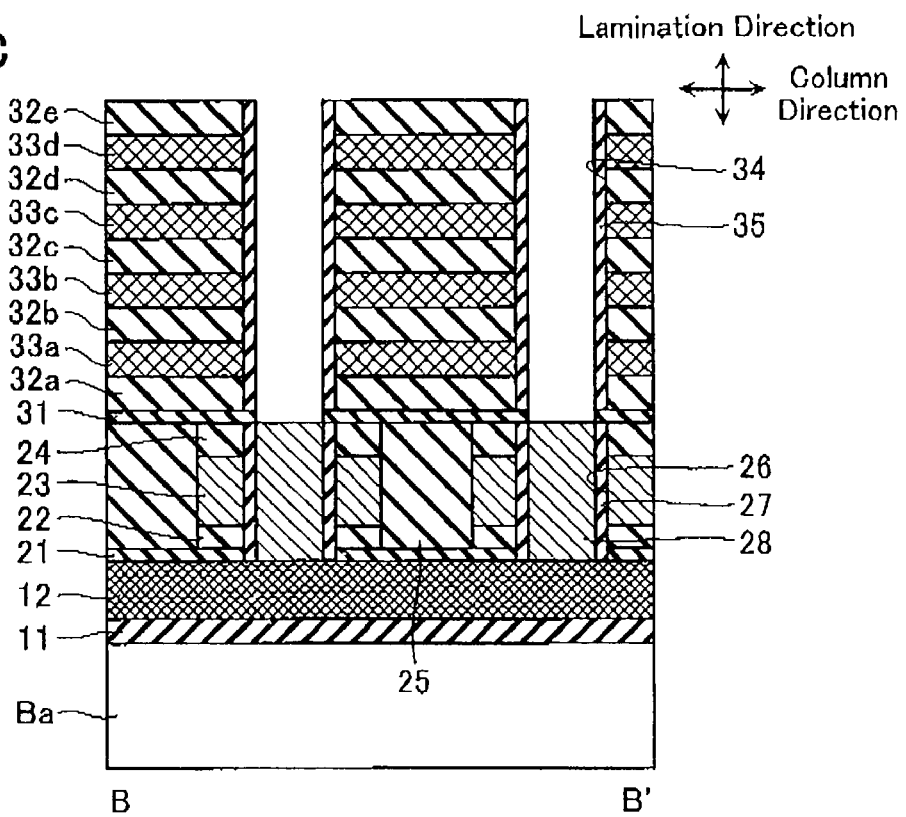
FIG. 16C is a cross-sectional view taken along line B-B' of FIG. 16A.

Then, as illustrated in FIGS. 16A to 16C, memory holes 34 are formed to penetrate the second protection layers 31, the fourth to eighth insulation layers 32a to 32e, and the first to fourth source-line conductive layers 33a to 33d. The memory holes 34 are formed at positions matching the transistor holes 26. The memory holes 34 are formed to be arranged in a matrix form as viewed from above. Furthermore, silicon oxide ($SiO_2$) is deposited on the sidewalls of the memory holes 34 to form memory gate insulation layers 35.

Subsequently, p-type polysilicon (p-Si) is deposited to fill up the memory holes 34 to form columnar layers 36. Through this manufacturing process, the non-volatile semiconductor storage device 100 of the first embodiment is formed as illustrated in FIG. 3 and FIGS. 4A to 4C.

(Advantages of Non-Volatile Semiconductor Storage Device 100 in First Embodiment)

Advantages of the non-volatile semiconductor storage device 100 according to the first embodiment will be described below. As can be seen from the above lamination structure, the non-volatile semiconductor storage device 100 of the first embodiment may achieve high integration.

In addition, as described in the above manufacturing process of the non-volatile semiconductor storage device 100, respective layers functioning as memory strings MS and selection transistor layers STr may be manufactured in a certain number of lithography steps, irrespective of the number of laminated layers. That is, the non-volatile semiconductor storage device 100 may be manufactured at a lower cost.

In addition, in the non-volatile semiconductor storage device 100, the first to fourth source-line conductive layers 33a to 33d include metal layers. Accordingly, the non-volatile semiconductor storage device 100 of the first embodiment may reduce its wiring resistance and enhance signals from memory cells so as to improve the reliability of operation.

Figure 17A:
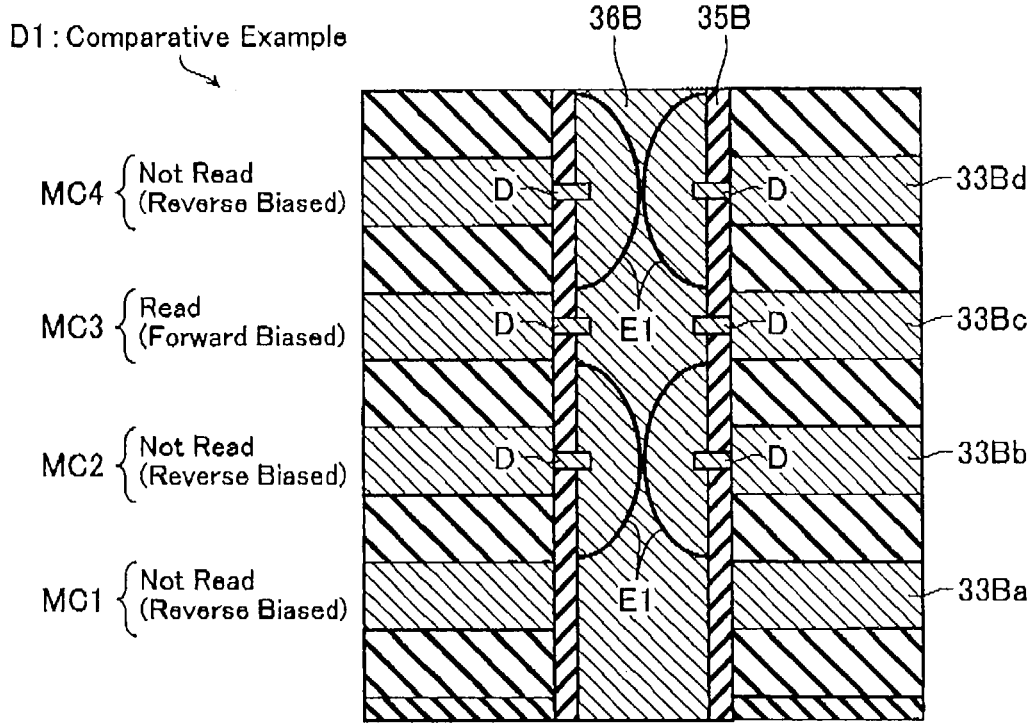
FIG. 17A illustrates a comparative example D1 in read operation.
Figure 17B:
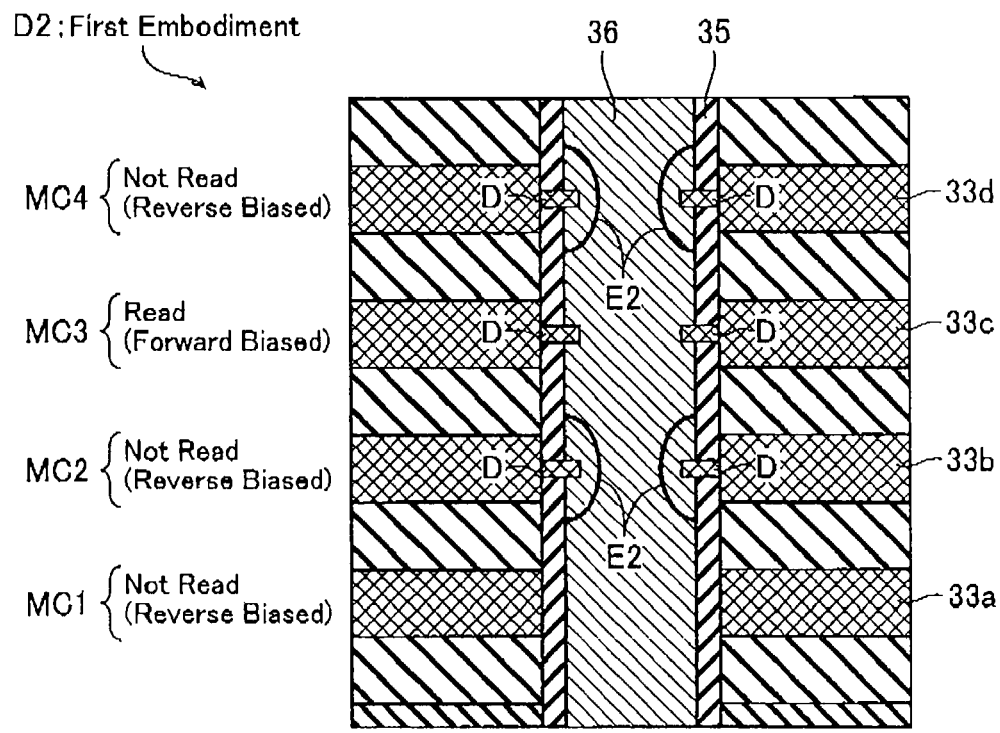
FIG. 17B is the first embodiment D2 in read operation.

Referring now to FIGS. 17A and 17B, advantages of the non-volatile semiconductor storage device 100 according to the first embodiment D2 will be described below, while compared with a comparative example (prior art) D1. FIG. 17A illustrates a comparative example D1 in read operation, and FIG. 17B illustrates a first embodiment D2 in read operation. Here, the comparative example D1 involves first to fourth source-line conductive layers 33Ba to 33Bd that are formed of $n^+$ type semiconductor layers, and a columnar layer 36B that is formed of a $p^+$ type semiconductor layer. The other configuration of the comparative example is assumed to be the same as the first embodiment.

As shown by D in FIGS. 17A and 17B, it is also assumed that while the memory gate insulation layers 35 (35B) of the memory elements MC2 to MC4 are broken down, the memory gate insulation layer 35 (35B) of the memory element MC1 is not. Furthermore, in FIGS. 17A and 17B, consider that data is read from the memory element MC3. In this case, forward bias is applied to the memory element MC3 for reading, while reverse bias applied to the memory elements MC1, MC2 and MC4 without reading.

The columnar layer 36B of the comparative example D1 has such a impurity concentration lower than that of the first embodiment D2. Thus, as illustrated in FIG. 17A, the comparative example D1 involves depletion layers E1 spreading across a wide range of the columnar layer 36B in read operation. Therefore, the comparative example D1 may fail to transfer voltage to the memory element MC3 for reading.

In contrast, the columnar layer 36 of the first embodiment D2 has such a impurity concentration higher than that of the comparative example D1. Accordingly, as illustrated in FIG. 17B, the first embodiment D2 suppresses the range of depletion layers E2 formed in read operation as compared with the comparative example D1. Therefore, the non-volatile semiconductor storage device 100 according to the first embodiment D2 may solve the problem associated with the comparative example D1 as mentioned above.

In addition, according to the comparative example D1, first to fourth source-line conductive layers 33Ba to 33Bd ($n^+$ type semiconductor layers) and a columnar layer 36B ($p^-$ type semiconductor layer) are included in a p-n diode. In contrast, according to the first embodiment D2, first to fourth source-line conductive layers 33a to 33d (metal layers) and a columnar layer 36 (a p-type semiconductor layer) are included in a Schottky diode SBD. In this case, the Schottky diode SBD involves a lower forward voltage drop and faster a switching speed than the p-n diode. That is, the first embodiment D2 has better switching characteristics than over the comparative example D1. In addition, due to the lower voltage drop, the first embodiment D2 may enhance signals from memory cells so as to improve the reliability of operation.

Second Embodiment (General Configuration of Non-Volatile Semiconductor Storage in Second Embodiment)

Figure 18:
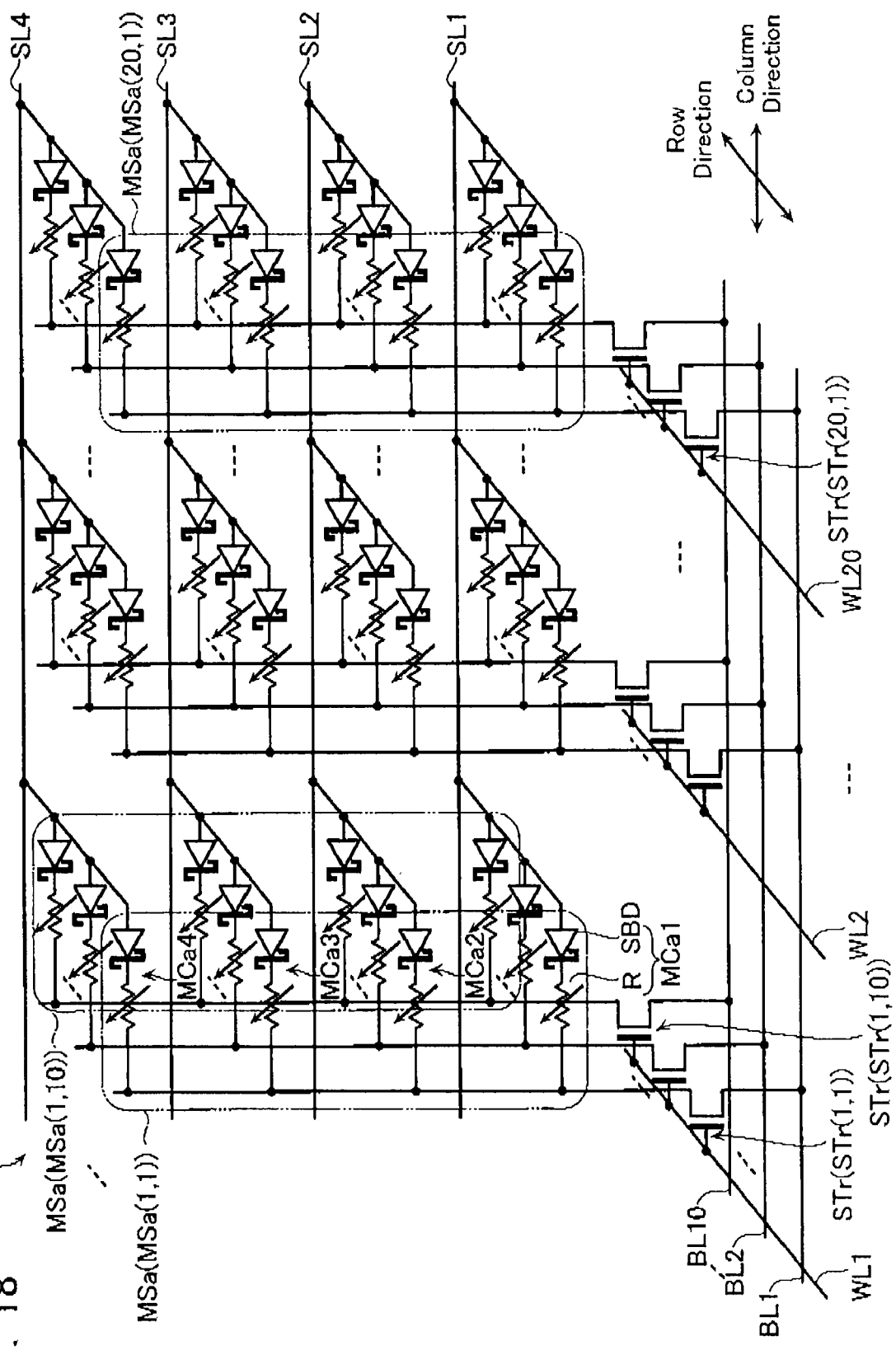
FIG. 18 is a circuit diagram illustrating a memory element region 1A in a non-volatile semiconductor storage device according to a second embodiment of the present invention.

Referring now to FIG. 18, a schematic configuration of a non-volatile semiconductor storage device according to a second embodiment will be described below. FIG. 18 is a circuit diagram illustrating a memory element region 1A in the non-volatile semiconductor storage device of the second embodiment. Note that the same reference numerals represent the same components as the first embodiment, and description thereof will be omitted in the second embodiment.

As illustrated in FIG. 18, the memory element region 1A of the second embodiment has memory strings MSa (MSa(1,1) to MSa(10,20)) that are different from the first embodiment. Each memory string MSa includes memory elements MCa1 to MCa4 that are different from the first embodiment.

Each of the memory elements MCa1 to MCa4 includes a resistance-change element R and a Schottky diode SBD as in the first embodiment.

In respective memory elements MCa1 to MCa4, the resistance-change elements R and the Schottky diodes SBD are connected in series as in the first embodiment. On the other hand, unlike the first embodiment, one ends of the resistance-change elements R are connected to the cathodes of the Schottky diodes SBD in the second embodiment. According to the second embodiment, the other ends of four resistance-change elements R in the same memory string MSa are commonly connected to each other. Among different memory strings MSa (MSa(1,1) to MSa(20,10)), the anodes of the Schottky diodes SBD in respective memory elements MCa1 are commonly connected to a source line SL1. Similarly, the anodes of the Schottky diodes SBD in respective memory elements MCa2 are commonly connected to a source line SL2 among different memory strings MSa. Moreover, the anodes of the Schottky diodes SBD in respective memory elements MC3a are commonly connected to a source line SL3 among different memory strings MSa. Furthermore, the anodes of the Schottky diodes SBD in respective memory elements MC4a are commonly connected to a source line SL4 among different memory strings MSa.

(Specific Configuration of Non-Volatile Semiconductor Storage Device in Second Embodiment)

A specific configuration of the non-volatile semiconductor storage device according to the second embodiment will now be described below. According to the second embodiment, the first to fourth source-line conductive layers 33a to 33d are formed of, e.g., any one of Pt, WC, WB, TaC, W, Pt, TiN, CoSi, and Co. In addition, the columnar layers 36 are formed of polysilicon (p-Si) doped with n-type impurities (n-type semiconductors). The columnar layers 36 are formed of semiconductor having such a impurity concentration that the first to fourth source-line conductive layers 33a to 33d and the semiconductor configure the Schottky diodes SBD. Specifically, the Schottky diodes SBD have respective cathodes at the columnar layers 36 side, and respective anodes at the first to fourth source-line conductive layers 33a to 33d side.

(Advantages of Non-Volatile Semiconductor Storage Device in Second Embodiment)

Advantages of the non-volatile semiconductor storage according to the second embodiment will be described below. The non-volatile semiconductor storage device of the second embodiment has substantially the same configuration as the first embodiment, providing the same advantages as the first embodiment.

Figure 19A:
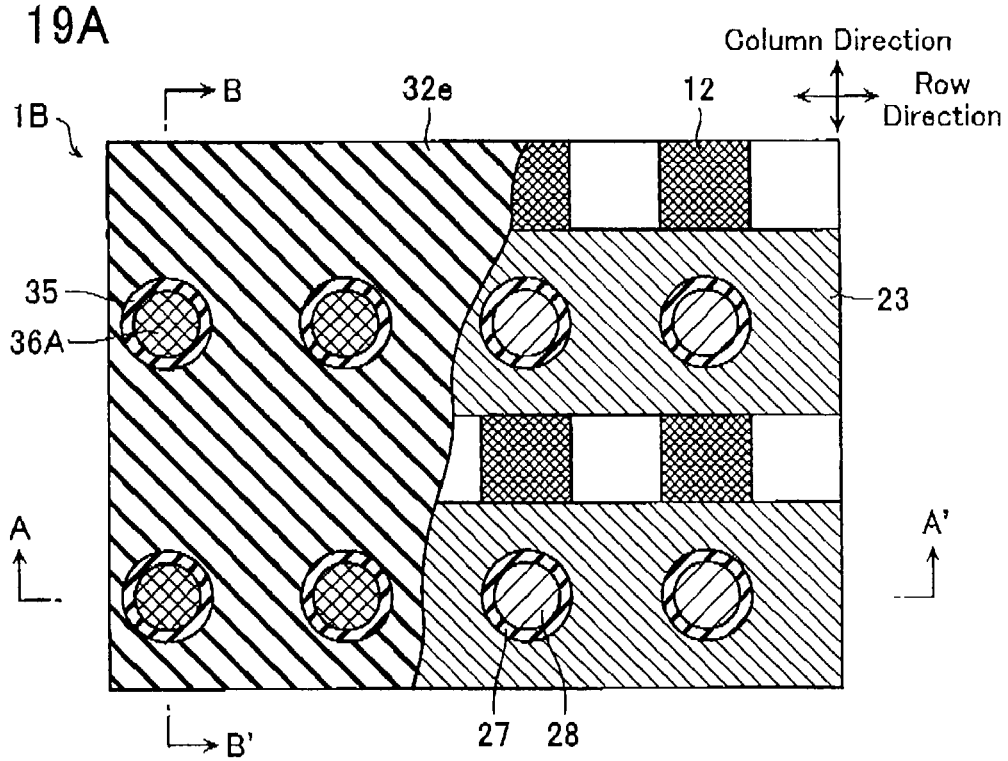
FIG. 19A is a top plan view of a memory element region 1B according to a third embodiment of the present invention.
Figure 19B:
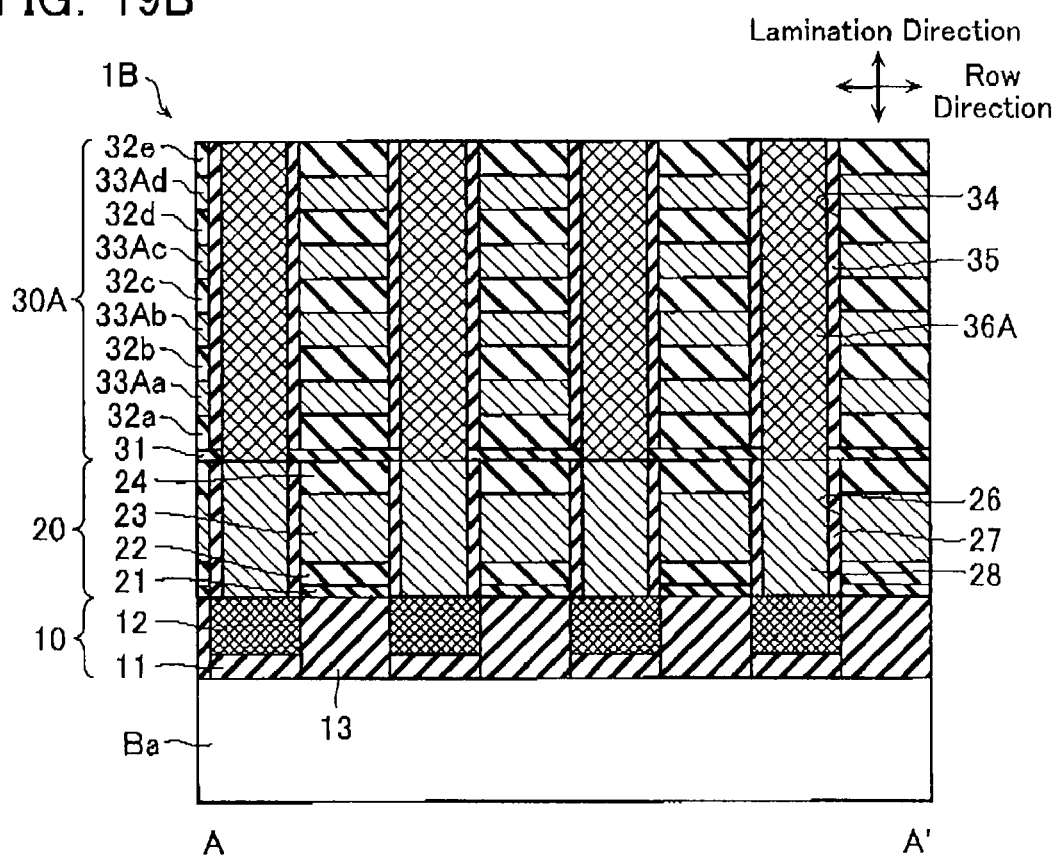
FIG. 19B is a cross-sectional view taken along line A-A' of FIG. 19A.
Figure 19C:
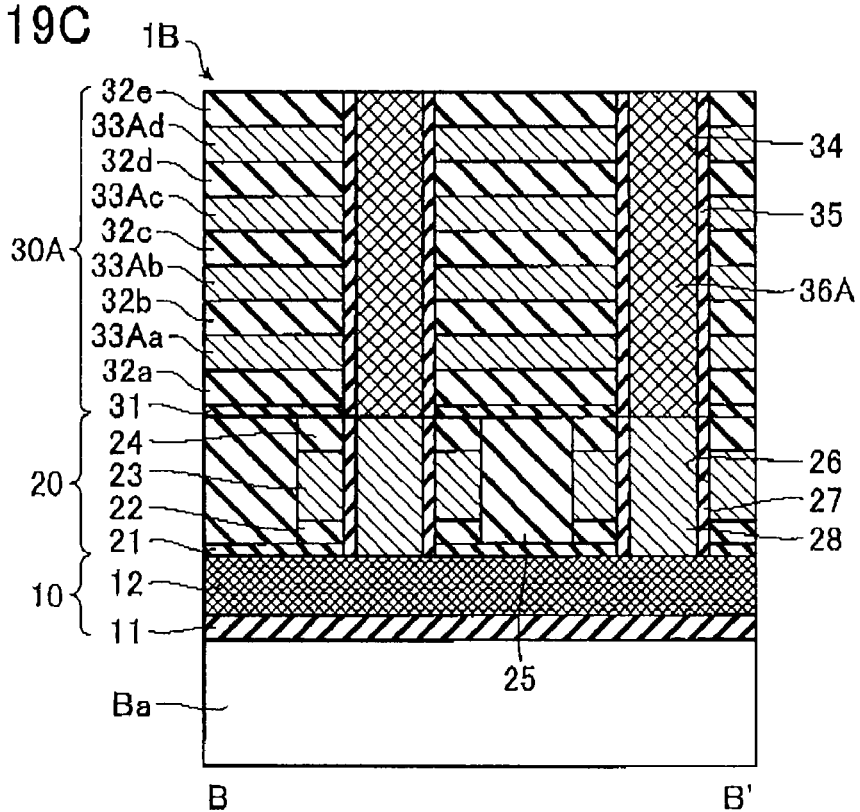
FIG. 19C is a cross-sectional view taken along line B-B' of FIG. 19A.

Third Embodiment (Specific Configuration of Non-Volatile) Semiconductor Storage Device in Third Embodiment Referring now to FIGS. 19A to 19C, a specific configuration of a non-volatile semiconductor storage device according to a third embodiment will be described below. FIG. 19A is a top plan view of a memory element region 1B of the third embodiment. FIG. 19B is a cross-sectional view taken along line A-A' of FIG. 19A; and FIG. 19C is a cross-sectional view taken along line B-B' of FIG. 19A. The right side of FIG. 19A illustrates the top surface of parts of a wiring layer 10 and a selection transistor layer 20. In addition, the left side of FIG. 19B illustrates the top surface of a memory portion 30A described below. Note that the same reference numerals represent the same components as the first and second embodiments, and description thereof will be omitted in the third embodiment.

As illustrated in FIGS. 19B and 19C, the memory element region 18 has a memory layer 30A that is different from the first and second embodiments. The memory layer 30A has first to fourth source-line conductive layers 33Aa to 33Ad and columnar layers 36A that are different from the first embodiment.

The first to fourth source-line conductive layers 33Aa to 33Ad are formed of polysilicon (p-Si) doped with n-type impurities (n-type semiconductors). The first to fourth source-line conductive layers 33Aa to 33Ad are formed of semiconductors having such a impurity concentration that the columnar layers 36A and the semiconductors configure the Schottky diodes SBD.

The columnar layers 36A include metal layers. The columnar layers 36A are formed of, e.g., any one of Pt, WC, WB, TaC, W, Pt, TiN, CoSi, and Co.

According to the configuration of the memory layer 30A mentioned above, the first to fourth source-line conductive layers 33Aa to 33Ad and the columnar layers 36A function as Schottky diodes SBD. Specifically, the Schottky diodes SBD have respective anodes at the columnar layers 36 side, and respective cathodes at the first to fourth source-line conductive layers 33Aa to 33Ad side.

(Advantages of Non-Volatile Semiconductor Storage Device in Third Embodiment)

Advantages of the non-volatile semiconductor storage according to the third embodiment will be described below. As in the first embodiment, the non-volatile semiconductor storage device of the third embodiment may achieve high integration and may be manufactured at a lower cost.

In addition, in the non-volatile semiconductor storage device of the third embodiment, the columnar layers 36A include metal layers. Accordingly, the non-volatile semiconductor storage device of the third embodiment may reduce its wiring resistance so as to improve the reliability of operation.

Fourth Embodiment (Specific Configuration of Non-Volatile Semiconductor Storage Device in Fourth Embodiment)

Figure 20:
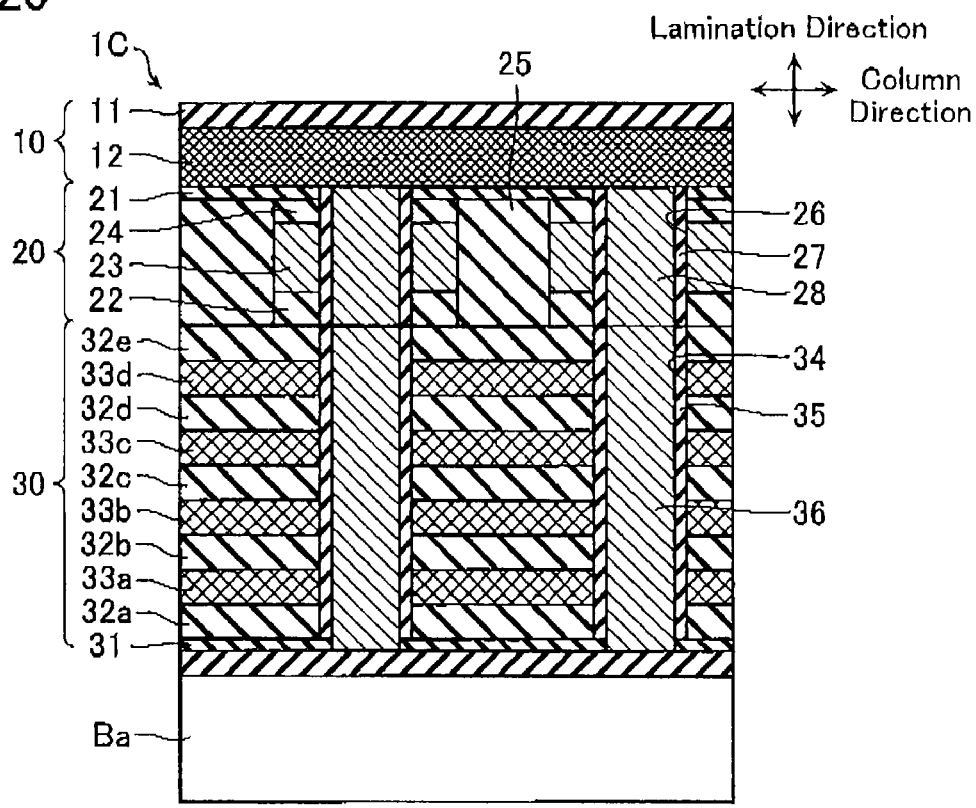
FIG. 20 is a cross-sectional view of a memory element region 1C according to a fourth embodiment of the present invention.

Referring now to FIG. 20, a specific configuration of a non-volatile semiconductor storage device according to a fourth embodiment will be described below. FIG. 20 is a cross-sectional view of a memory element region 1C according to the fourth embodiment. Note that the same reference numerals represent the same components as the first to third embodiments, and description thereof will be omitted in the fourth embodiment.

As illustrated in FIG. 20, in the memory element region 1C, the selection transistor layer 20 is located above the memory layer 30, unlike the first embodiment. In addition, the wiring layer 10 is also located above the selection transistor layer 20.

(Advantage of Non-Volatile Semiconductor Storage Device in Fourth Embodiment)

Advantages of the non-volatile semiconductor storage according to the fourth embodiment will be described below. The non-volatile semiconductor storage device of the fourth embodiment has substantially the same configuration as the first embodiment, providing the same advantages as the first embodiment.

Furthermore, the non-volatile semiconductor storage device of the fourth embodiment has the wiring layer 10 and the selection transistor layer 20 provided above the memory layer 30. Accordingly, the non-volatile semiconductor storage device of the fourth embodiment may offer increased flexibility in wiring bit lines BL and word lines WL.

Fifth Embodiment (Specific Configuration of Non-Volatile Semiconductor Storage Device in Fifth Embodiment)

Figure 21:
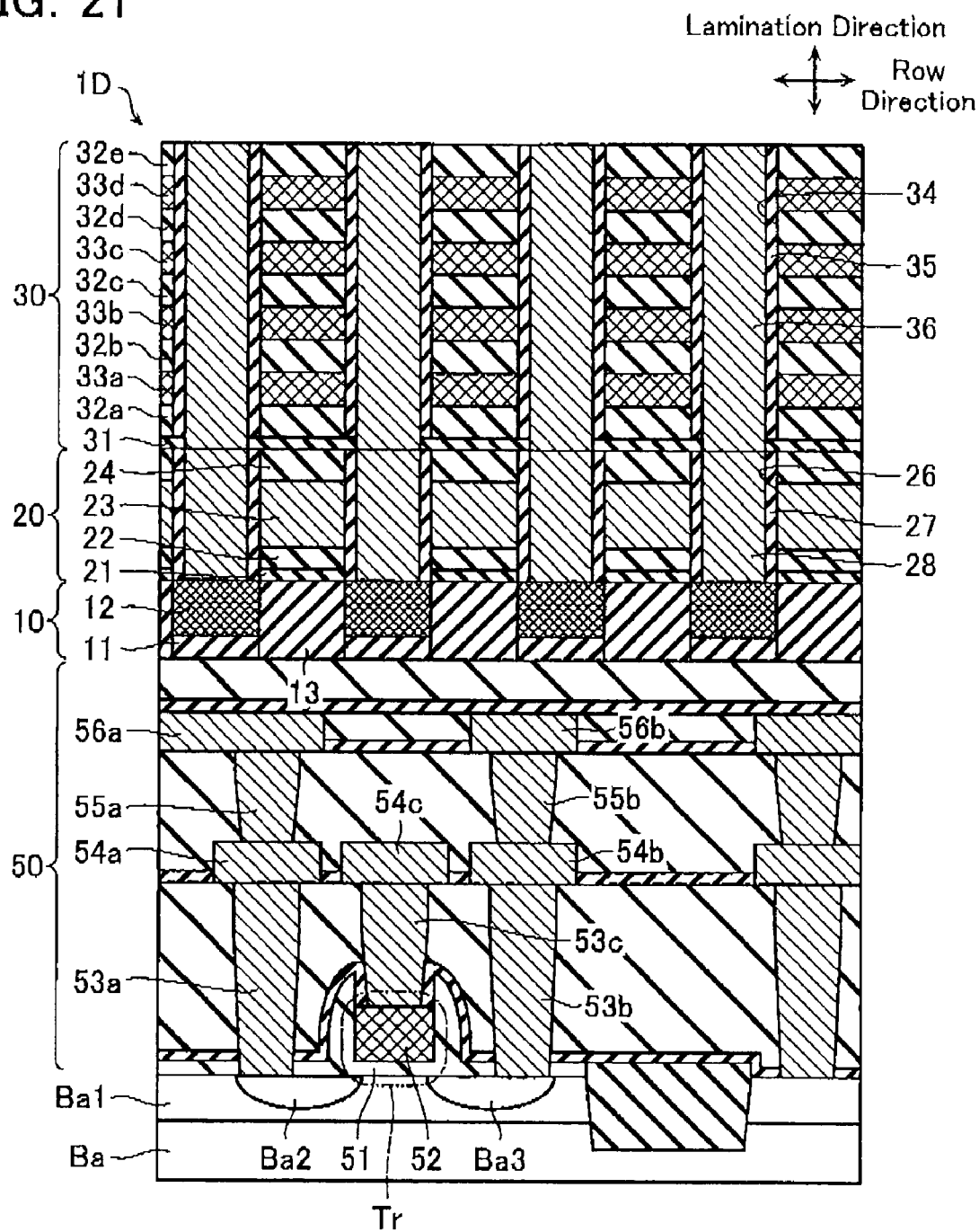
FIG. 21 is a cross-sectional view of a memory element region 1D according to a fifth embodiment of the present invention.

Referring now to FIG. 21, a specific configuration of a non-volatile semiconductor storage device according to a fifth embodiment will be described below. FIG. 21 is a cross-sectional view of a memory element region 1D according to the fifth embodiment. Note that the same reference numerals represent the same components as the first to fourth embodiments, and description thereof will be omitted in the fifth embodiment.

As in the first embodiment, the memory element region 1D has the wiring layer 10, the selection transistor layer 20, and the memory layer 30. Furthermore, the memory element region 1D has a control circuit layer 50 between the substrate Ba and the wiring layer 10. The control circuit layer 50 functions as a control circuit (e.g., a sense amplifier or a row decoder) that controls the memory strings MS and the selection transistors STr.

The substrate Ba has a base region Ba1 and a pair of source/drain regions Ba2 and Ba3 on its surface. Each drain region Ba3 is formed at a certain distance from the corresponding source region Ba2. For example, the base region Ba1 is formed of a p-type semiconductor, and the source/drain regions Ba2 and Ba3 are formed of n-type semiconductors. Alternatively, the base region Ba1 may be formed of an n-type semiconductor, while the source/drain regions Ba2 and Ba3 being formed of p-type semiconductors.

The control circuit layer 50 has a gate insulation layer 51 that is formed across the corresponding source/drain regions Ba2 and Ba3 on the top surface of the substrate Ba, and a gate conductive layer 52 that is formed on the corresponding gate insulation layer 51.

The control circuit layer 50 also has first contact layers 53a, 53b and 53c, as well as first wiring layers 54a, 54b and 54c. The first contact layers 53a, 53b and 53c are formed in contact with the top surfaces of the source/drain regions Ba2 and Ba3 and the top surface of the gate conductive layer 52, respectively, so as to extend in the lamination direction. The first wiring layers 54a, 54b and 54c are connected to the first contact layers 53a, 53b and 53c, respectively.

The control circuit layer 50 also has second contact layers 55a and 55b as well as second wiring layers 56a and 56b. The second contact layers 55a and 55b are formed in contact with the top surfaces of the first wiring layers 54a and 54b, respectively, so as to extend in the lamination direction. The second wiring layers 56a and 56b are connected to the second contact layers 55a and 55b, respectively.

According to the configuration of the control circuit layer 50 mentioned above, the source/drain regions Ba2 and Ba3, the gate insulation layer 51, and the gate conductive layer 52 function as transistors Tr. Each source region Ba2 functions as the source of the corresponding transistor Tr, and each drain region Ba3 functions as the drain of the corresponding transistor Tr. Each gate conductive layer 52 functions as the control gate of the corresponding transistor Tr.

(Advantages of Non-Volatile Semiconductor Storage Device in Fifth Embodiment)

Advantages of the non-volatile semiconductor storage according to the fifth embodiment will be described below. The non-volatile semiconductor storage device of the fifth embodiment has substantially the same configuration as the first embodiment, providing the same advantages as the first embodiment.

Furthermore, the non-volatile semiconductor storage device of the fifth embodiment has the control circuit layer 50 between the substrate Ba and the wiring layer 10. Therefore, the non-volatile semiconductor storage device of the fifth embodiment may reduce its occupation area as compared with that of the first embodiment.

Other Embodiments

While embodiments of the non-volatile semiconductor storage device have been described, the present invention is not intended to be limited to the disclosed embodiments, and various other changes, additions, substitutions or the like may be made thereto without departing from the spirit of the invention.

For example, in the third embodiment, the first to fourth source-line conductive layers 33Aa to 33Ad may be formed of p-type polysilicon, and the columnar layers 36A may be formed of any one of TiB, TaB, HfSix, TiN, and Ta. That is, the Schottky diodes SBD may have respective cathodes at the columnar layers 36A side, and respective anodes at the first to fourth source-line conductive layers 33Aa to 33Ad side.

What is claimed is:

1. A non-volatile semiconductor storage device comprising:
 a plurality of memory element groups, each of the memory element groups having a plurality of memory elements, each of the memory elements having a resistance-change element and a Schottky diode connected in series,
 each of the memory element groups comprising:
  a first columnar layer extending in a lamination direction;
  a first insulation layer formed on a side surface of the first columnar layer and functioning as the resistance-change element; and
  a first conductive layer formed to surround the first columnar layer via the first insulation layer,
 the first conductive layer being formed of metal, and
 the first columnar layer being formed of a semiconductor having such a impurity concentration that the first conductive layer and the semiconductor configure the Schottky diode.

2. The non-volatile semiconductor storage device according to claim 1, wherein
 the first conductive layer is formed of any one of TiB, TaB, HfSix, TiN, and Ta,
 the first columnar layer is formed of p-type polysilicon, and
 the first conductive layer and the first columnar layer configure the Schottky diode having an anode as the first columnar layer and a cathode as the first conductive layer.

3. The non-volatile semiconductor storage device according to claim 1, wherein
 the first conductive layer is formed of any one of Pt, WC, WB, TaC, W, Pt, TiN, CoSi, and Co,
 the first columnar layer is formed of n-type polysilicon, and
 the first conductive layer and the first columnar layer configure the Schottky diode having a cathode as the first columnar layer and an anode as the first conductive layer.

4. The non-volatile semiconductor storage device according to claim 1, further comprising a control circuit configured to control the memory element groups, wherein
 the control circuit is formed below the memory element groups.

5. The non-volatile semiconductor storage device according to claim 4, wherein
 the control circuit comprises a transistor, the transistor comprising:
  a source region formed on a surface of a substrate and functioning as a source of the transistor;
  a drain region formed on the surface of the substrate at a certain distance from the source region and functioning as a drain of the transistor; and
  a gate conductive layer formed across the source region and the drain region and functioning as a control gate of the transistor.

6. The non-volatile semiconductor storage device according to claim 1, further comprising a selection transistor connected to one end of each of the memory element groups and configured to control conduction to the memory element groups,
 wherein the selection transistor comprises:
  a second columnar layer extending in a lamination direction from a top or bottom surface of the first columnar layer and functioning as a body of the selection transistor;
  a second insulation layer formed on a side surface of the second columnar layer; and
  a second conductive layer formed to surround the second columnar layer via the second insulation layer and functioning as a control gate of the selection transistor.

7. The non-volatile semiconductor storage device according to claim 6, wherein
 the second columnar layer is formed of a p-type semiconductor, and
 the second conductive layer is formed of an n-type semiconductor.

8. A non-volatile semiconductor storage device comprising;
a plurality of memory element groups, each of the memory element groups having a plurality of memory elements, each of the memory elements having a resistance-change element and a Schottky diode connected in series,
each of the memory element groups comprising:
a first columnar layer extending in a lamination direction;
a first insulation layer formed on a side surface of the first columnar layer and functioning as the resistance-change element; and
a first conductive layer formed to surround the first columnar layer via the first insulation layer,
the first columnar layer being formed of metal, and
the first conductive layer being formed of a semiconductor having such a impurity concentration that the first columnar layer and the semiconductor configure the Schottky diode.

9. The non-volatile semiconductor storage device according to claim 8, wherein
the first columnar layer is formed of any one of TiB, TaB, HfSix, TiN, and Ta,
the first conductive layer is formed of p-type polysilicon, and
the first columnar layer and the first conductive layer configure the Schottky diode having an anode as the first columnar layer and a cathode as the first conductive layer.

10. The non-volatile semiconductor storage device according to claim 8, wherein
the first columnar layer is formed of any one of Pt, WC, WB, TaC, W, Pt, TiN, CoSi, and Co,
the first conductive layer is formed of n-type polysilicon, and
the first columnar layer and the first conductive layer configure the Schottky diode having a cathode as the first columnar layer and an anode as the first conductive layer.

11. The non-volatile semiconductor storage device according to claim 8, further comprising a control circuit configured to control the memory element groups, wherein
the control circuit is formed below the memory element groups.

12. The non-volatile semiconductor storage device according to claim 11, wherein
the control circuit comprises a transistor, the transistor comprising:
a source region formed on a surface of a substrate and functioning as a source of the transistor;
a drain region formed on the surface of the substrate at a certain distance from the source region and functioning as a drain of the transistor; and
a gate conductive layer formed across the source region and the drain region and functioning as a control gate of the transistor.

13. The non-volatile semiconductor storage device according to claim 8, further comprising a selection transistor connected to one end of each of the memory element groups and configured to control conduction to the memory element groups,
wherein the selection transistor comprises:
a second columnar layer extending in a lamination direction from a top or bottom surface of the first columnar layer and functioning as a body of the selection transistor;
a second insulation layer formed on a side surface of the second columnar layer; and
a second conductive layer formed to surround the second columnar layer via the second insulation layer and functioning as a control gate of the selection transistor.

14. The non-volatile semiconductor storage device according to claim 13, wherein
the second columnar layer is formed of a p-type semiconductor, and
the second conductive layer is formed of an n-type semiconductor.

15. A method of manufacturing a non-volatile semiconductor storage device having a plurality of memory element groups, each of the memory element groups having a plurality of memory elements, each of the memory elements having a resistance-change element and a Schottky diode connected in series, the method comprising:
laminating a plurality of first conductive layers;
forming a first hole to penetrate the plurality of first conductive layers;
forming a first insulation layer on a side surface of the first hole, the first insulation layer functioning as the resistance-change element; and
forming a first columnar layer to fill up the first hole,
the first conductive layers being formed of metal; and
the first columnar layer being formed of a semiconductor having such a impurity concentration that the first conductive layers and the semiconductor configure the Schottky diode.

16. The method of manufacturing the non-volatile semiconductor storage device according to claim 15, wherein
the first conductive layers are formed of any one of TiB, TaB, HfSix, TiN, and Ta, and
the first columnar layer is formed of p-type polysilicon.

17. The method of manufacturing the non-volatile semiconductor storage device according to claim 15, wherein
the first conductive layers are formed of any one of Pt, WC, WB, TaC, W, Pt, TiN, CoSi, and Co, and
the first columnar layer is formed of n-type polysilicon.

18. The method of manufacturing the non-volatile semiconductor storage device according to claim 15, further comprising:
depositing a second conductive layer prior to the lamination of the first conductive layers, the second conductive layer functioning as a control gate of a selection transistor, the selection transistor controlling conduction to the memory element groups;
forming a second hole to penetrate the second conductive layer;
forming a second insulation layer on a side surface of the second hole; and
forming a second columnar layer to fill up the second hole, the second columnar layer functioning as a body of the selection transistor.

19. The method of manufacturing the non-volatile semiconductor storage device according to claim 18, wherein
the second columnar layer is formed of a p-type semiconductor, and
the second conductive layer is formed of an n-type semiconductor.

20. The method of manufacturing the non-volatile semiconductor storage device according to claim 18, further comprising:

depositing a third conductive layer prior to the deposition of the second conductive layer, the third conductive layer functioning as a wiring connected to one end of the selection transistor; and forming a trench to penetrate the third conductive layer and extend in a first direction orthogonal to a lamination direction at a certain pitch in a second direction, the second direction being orthogonal to the lamination and first directions.

* * * * *